(12) United States Patent
Finn

(10) Patent No.: US 8,091,208 B2
(45) Date of Patent: Jan. 10, 2012

(54) METHOD OF FORMING AN INLAY SUBSTRATE HAVING AN ANTENNA WIRE

(76) Inventor: David Finn, Tourmakeady (IE)

( * ) Notice: Subject to any disclaimer, the term of this patent is extended or adjusted under 35 U.S.C. 154(b) by 242 days.

(21) Appl. No.: 12/430,085

(22) Filed: Apr. 26, 2009

(65) Prior Publication Data

US 2009/0229109 A1    Sep. 17, 2009

Related U.S. Application Data

(62) Division of application No. 11/733,756, filed on Apr. 10, 2007, now Pat. No. 7,546,671.

(60) Provisional application No. 60/826,923, filed on Sep. 26, 2006, provisional application No. 60/883,064, filed on Jan. 1, 2007, provisional application No. 60/884,158, filed on Jan. 9, 2007, provisional application No. 60/887,294, filed on Jan. 30, 2007, provisional application No. 60/894,469, filed on Mar. 13, 2007.

(51) Int. Cl.
*H01P 11/00*    (2006.01)
*H01Q 13/00*    (2006.01)

(52) U.S. Cl. ............. 29/600; 29/592.1; 29/606; 29/832; 343/700 MS; 343/786

(58) Field of Classification Search ............. 29/600, 29/592.1, 825, 833–832; 343/700 MS, 786
See application file for complete search history.

(56) References Cited

U.S. PATENT DOCUMENTS

| | | |
|---|---|---|
| 3,674,914 A | 7/1972 | Burr |
| 4,437,603 A | 3/1984 | Kobayashi et al. |
| 4,533,787 A | 8/1985 | Anderegg et al. |
| 4,641,773 A | 2/1987 | Morino et al. |
| 4,693,778 A | 9/1987 | Swiggett et al. |
| 4,730,188 A | 3/1988 | Milheiser |
| 4,884,334 A | 12/1989 | Houser et al. |
| 4,912,143 A | 3/1990 | Ahn et al. |
| 5,041,826 A | 8/1991 | Milheiser |
| 5,083,087 A | 1/1992 | Fox et al. |
| 5,094,907 A | 3/1992 | Yamura et al. |
| 5,166,676 A | 11/1992 | Milheiser |
| 5,201,453 A | 4/1993 | Amador et al. |
| 5,211,129 A | 5/1993 | Taylor et al. |
| 5,281,855 A | 1/1994 | Hadden et al. |
| 5,340,946 A | 8/1994 | Friedrich et al. |
| 5,365,657 A | 11/1994 | Brown et al. |

(Continued)

FOREIGN PATENT DOCUMENTS

| | | |
|---|---|---|
| CA | 2555034 | 9/2005 |

(Continued)

*Primary Examiner* — Minh Trinh

(57) ABSTRACT

Forming an inlay comprising an antenna wire having two end portions and a site for a transponder chip, comprises: mounting the wire to a surface of substrate; and leaving the end portions of the antenna wire free-standing, as loops adjacent terminal areas of a site on the substrate for the transponder chip. With the transponder chip installed on the substrate, the free-standing loops are repositioned to be substantially directly over the terminals of the transponder chip, in preparation for interconnection of the loops to the terminals of the transponder chip, then are bonded to the terminals. An embedding tool for mounting the wire on the substrate may embed the wire in or adhesively place a self-bonding wire on a surface of the substrate. The substrate may have two transponder chips, and function as a secure inlay. An anti-skimming feature is included in the inlay.

17 Claims, 8 Drawing Sheets

U.S. PATENT DOCUMENTS

| | | | |
|---|---|---|---|
| 5,491,302 | A | 2/1996 | Distefano et al. |
| 5,598,032 | A | 1/1997 | Fidalgo |
| 5,682,143 | A | 10/1997 | Brady et al. |
| 5,773,812 | A | 6/1998 | Kreft |
| 5,786,626 | A | 7/1998 | Brady et al. |
| 5,809,633 | A | 9/1998 | Mundigl et al. |
| 6,008,993 | A | 12/1999 | Kreft |
| 6,088,230 | A | 7/2000 | Finn et al. |
| 6,095,423 | A | 8/2000 | Houdeau et al. |
| 6,095,915 | A | 8/2000 | Geissler |
| 6,107,920 | A | 8/2000 | Eberhardt et al. |
| 6,142,381 | A | 11/2000 | Finn et al. |
| 6,190,942 | B1 | 2/2001 | Wilm et al. |
| 6,206,292 | B1 | 3/2001 | Robertz et al. |
| 6,233,818 | B1 | 5/2001 | Finn et al. |
| 6,259,369 | B1 | 7/2001 | Monico |
| 6,288,443 | B1 | 9/2001 | Finn et al. |
| 6,310,778 | B1 | 10/2001 | Finn et al. |
| 6,471,878 | B1 | 10/2002 | Greene et al. |
| 6,521,829 | B2 | 2/2003 | Matsumura et al. |
| 6,606,247 | B2 | 8/2003 | Credelle et al. |
| 6,626,364 | B2 | 9/2003 | Taban |
| 6,628,240 | B2 | 9/2003 | Amadeo |
| 6,662,430 | B2 | 12/2003 | Brady et al. |
| 6,667,092 | B1 | 12/2003 | Brollier et al. |
| 6,677,917 | B2 | 1/2004 | Van Heerden et al. |
| 6,698,089 | B2 | 3/2004 | Finn et al. |
| 6,870,497 | B2 | 3/2005 | Kondo et al. |
| 6,881,605 | B2 | 4/2005 | Lee et al. |
| 7,011,980 | B1 | 3/2006 | Na et al. |
| 7,295,161 | B2 | 11/2007 | Gaucher et al. |
| 7,546,671 | B2 * | 6/2009 | Finn ............... 29/592.1 |
| 7,581,308 | B2 * | 9/2009 | Finn ............... 29/600 |
| 2002/0020903 | A1 | 2/2002 | Kreft et al. |
| 2004/0089707 | A1 | 5/2004 | Cortina et al. |
| 2004/0155114 | A1 | 8/2004 | Rietzler |
| 2005/0206524 | A1 | 9/2005 | Forster et al. |
| 2005/0282355 | A1 | 12/2005 | Edwards et al. |
| 2005/0282495 | A1 | 12/2005 | Forster |
| 2006/0114109 | A1 | 6/2006 | Geissler |

FOREIGN PATENT DOCUMENTS

| | | |
|---|---|---|
| DE | 28 11 458 | 2/1979 |
| DE | 36 22 246 | 1/1987 |
| DE | 42 05 084 | 9/1993 |
| DE | 195 25 933 | 1/1997 |
| DE | 195 41 039 | 5/1997 |
| DE | 196 10 507 | 9/1997 |
| DE | 196 16 424 | 10/1997 |
| DE | 196 54 902 | 10/1997 |
| DE | 196 34 473 | 1/1998 |
| DE | 196 46 717 | 5/1998 |
| DE | 196 51 566 | 6/1998 |
| DE | 197 16 912 | 11/1998 |
| DE | 197 41 984 | 6/1999 |
| DE | 198 50 353 | 3/2000 |
| DE | 199 20 593 | 11/2000 |
| DE | 10 2004 043 747 | 3/2006 |
| DE | 20 2005 016 382 | 3/2006 |
| GB | 1 593 235 | 7/1981 |
| JP | 63 51194 A | 12/1994 |
| WO | WO 91 16718 | 10/1991 |
| WO | WO 95 26538 | 10/1995 |
| WO | WO 97 30418 | 8/1997 |
| WO | WO 97 35273 | 9/1997 |
| WO | WO 00/21030 | 4/2000 |
| WO | WO 00/36891 | 6/2000 |
| WO | WO 00 68994 | 11/2000 |
| WO | WO 2006 050691 | 5/2006 |

* cited by examiner

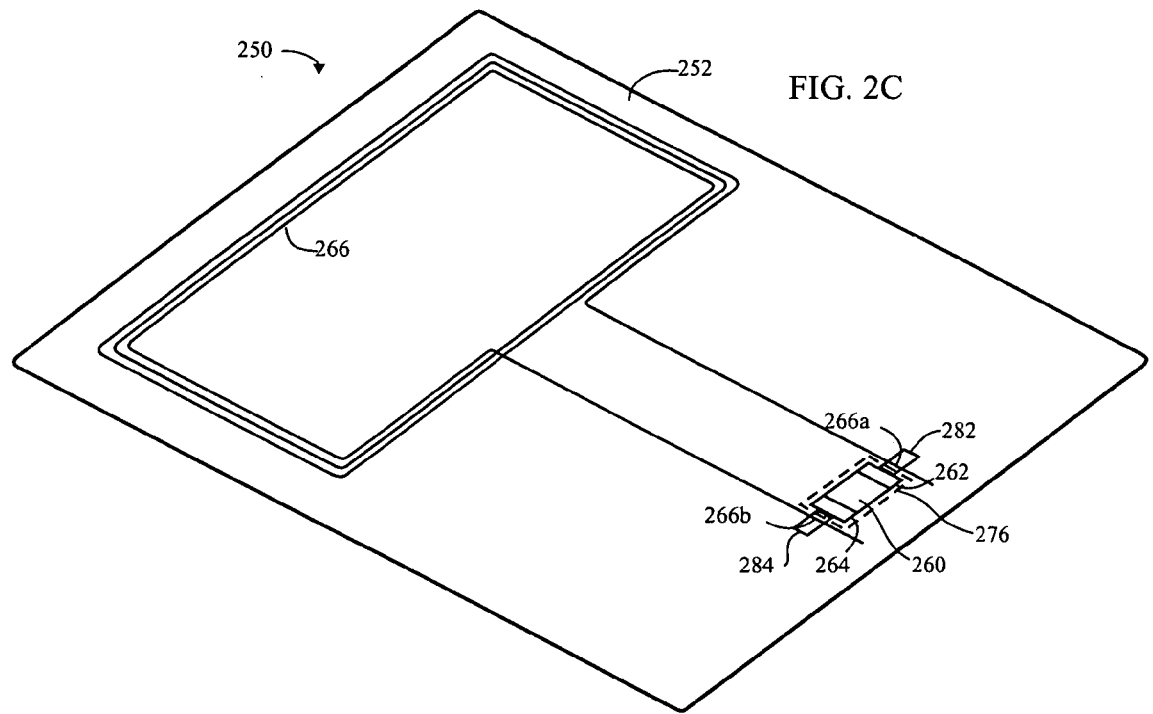
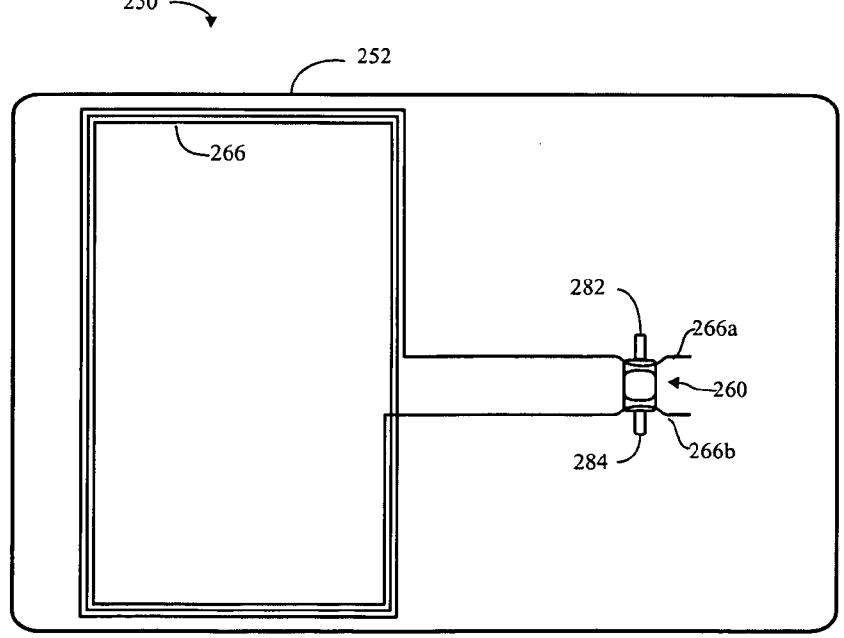

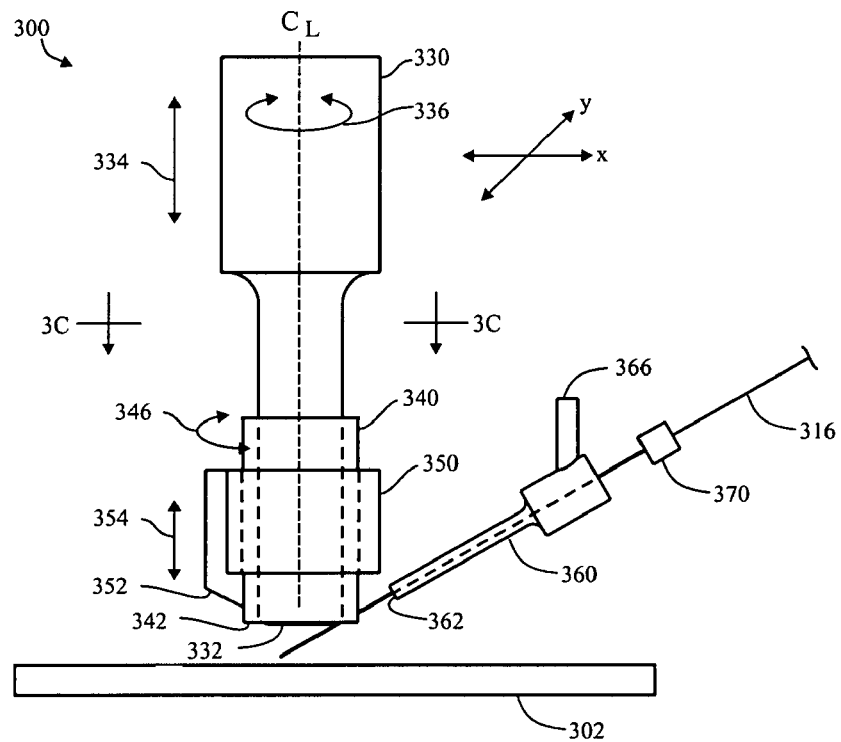
FIG. 3A
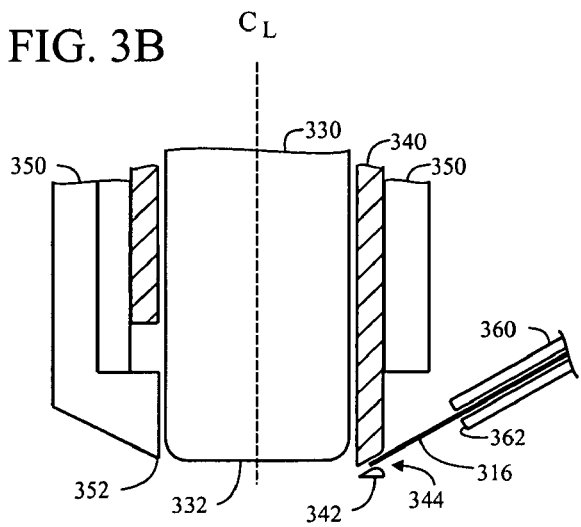
FIG. 3B
FIG. 3C

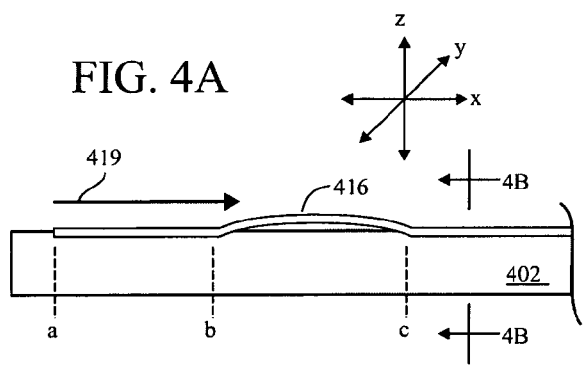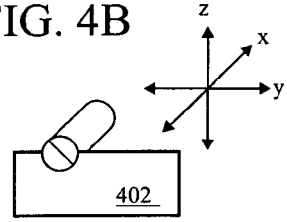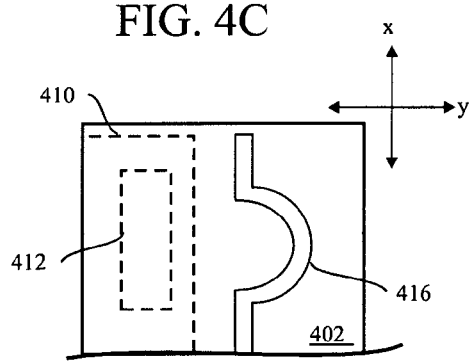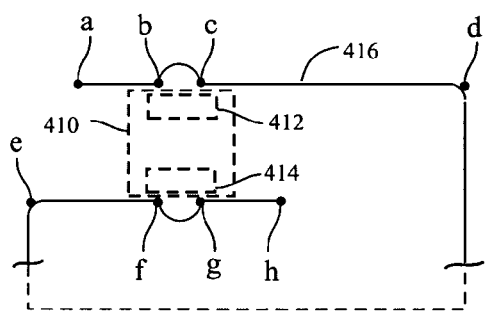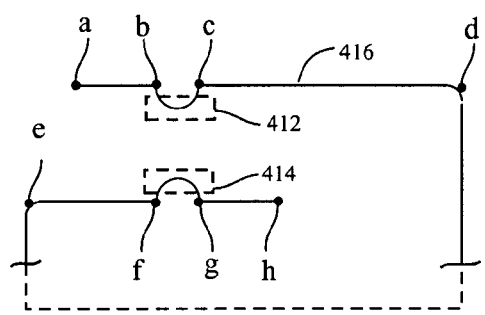

METHOD OF FORMING AN INLAY SUBSTRATE HAVING AN ANTENNA WIRE

CROSS-REFERENCE TO RELATED APPLICATIONS

This patent application is a division of Ser. No. 11/733,756 filed Apr. 10, 2007 (status: allowed), which claims benefit of the following U.S. Provisional Patent applications, all of which are incorporated by reference in their entirety herein:
60/826,923 filed 26 Sep. 2006 by Finn,
60/883,064 filed 1 Jan. 2007 by Finn,
60/884,158 filed 9 Jan. 2007 by Finn,
60/887,294 filed 30 Jan. 2007 by Finn, and
60/894,469 filed 13 Mar. 2007 by Finn.

FIELD OF THE INVENTION

In one aspect, the invention relates to mounting (either embedding in or placing on) an antenna wire on an insulating substrate, such as for (but not limited to) a secure inlay.

In another aspect, the invention relates to method and apparatus for embedding an antenna wire in an insulating substrate, such as for (but not limited to) a secure inlay.

In another aspect, the invention relates to techniques for preparing ends of an antenna wire mounted to a substrate for connection to terminals of an RFID (transponder) chip, such as for (but not limited to) a secure inlay.

In another aspect, the invention relates to secure inlays themselves, containing radio frequency identification (RFID) chips.

BACKGROUND OF THE INVENTION

In the production of access control cards, contactless payment cards (credit/debit), dual interface cards, health cards, national e-ID cards, electronic passports and driving licenses, an "inlay" containing an RFID (Radio Frequency Identification) chip (typically packaged in a module) and an antenna is manufactured separately from the final product (e.g., electronic passport).

The U.S. Department of State, Bureau of Consular Affairs, in cooperation with the Department of Homeland Security (DHS), plan to develop and implement a card-format passport, a credit-card-size travel document. The Passport Card will be an alternative format document to the traditional book-style passport for presentation at U.S. land border crossings.

The Passport Card shall display the citizen's facial image and biographic information as well as having machine-readable capability compliant with ICAO 9303 and an embedded Radio Frequency (RF)-capable integrated contactless circuit (ICC) and antenna.

The tamper-resistant/counterfeit-resistant Passport Card stock shall have embedded ISO/IEC 18000 6C compliant RF capability.

The embedded integrated contactless circuit (ICC) shall be EPCglobal Class-1 Generation-2 UHF RFID certified and the card shall comply with EPCglobal Class-1 Generation-2 UHF RFID standards.

The conventional method to produce an inlay is to embed insulated wire into a synthetic material or coated substrate, form an antenna with a number of turns and interconnect the wire ends of the antenna to a transponder chip module. Etching and silkscreen printing can also be used to form the antenna, and the interconnection process can be via flip-chip technology. An additional antenna (for inductive coupling) not connected to the RFID chip can also be used to augment the read/write range of the transponder inlay.

The bonding of the IC (integrated circuit) to the chip module and the interconnection of the antenna to the module are critical elements of the electronic passport (for example). Generally, the mechanical resistance of these components are major drivers of durability.

In the case of a "secure" (as used herein, "secure" implies using contactless communication) smart card, the inlay is typically produced by an inlay manufacturer, then it is sent in a "pre-laminated" state to the secure card manufacturer for final lamination with upper & lower printed sheets (integration into the finished product). Similarly, in the production of electronic passports the pre-laminated inlay (hot or cold laminated) is sent to the government printing office for insertion into the passport booklet.

After integration of the inlay into the finished product, personalization (key transfer, programming and initialization) of the secure card (for example) is performed by a personalization bureau or letter-shop, and the individualization of an electronic passport (for example) can either be before or after the printing process, commonly known as pre- & post-personalization at the issuing authority. In the case of electronic passports, national identity cards and driving licenses, the personalization is implemented with a single document printer.

The fact that the personalization (individualization) of the finished product with the user credentials is performed at the end of the value chain means that security issues arise from the loss of chips, inlays and finished products before this final process. In addition, yield loss along the entire production process must be accounted for and securely stored.

Firstly, it can be argued that the RFID chip with encryption technology could be used to store critical data relating to the production process, but this argument is only valid if the transponder functions correctly. Secondly, the critical data could be stored at a certified trust centre or central database and could be accessed by scanning the machine readable zone (OCR-B characters—Optical Character Recognition) on the passport, but this defeats the purpose of an electronic travel document.

Although, the US legislation on border control "Enhanced Border Security and Visa Reform Entry Act" stated that the countries with which the USA has a visa waiver arrangement should have a biometric passport issuance program. And according to the legislation, these passports need to be tamper-proof machine-readable passports (MRP) that incorporate contactless IC chips, as well as biometric identifiers (facial images, fingerprints, iris scans) that comply with standards established by ICAO (International Civil Aviation Organization), the problem of accountability of the passport in the value chain is not resolved.

The current state of the art for dual transponder cards & inlays is the combination of low (125 KHz) and high (13.56 MHz) frequency devices, primarily for access control, ticketing and vending (micro-payment).

Contactless chip card technology is based on two standards: ISO/IEC 14443 Type A and Type B (for proximity cards), and ISO/IEC 15693 (for vicinity cards). Cards that comply with these standards operate at the 13.56 MHz frequency. ISO/IEC 14443 products have a range of up to 10 cm (centimeters), while ISO/IEC 15693 products can operate at a range between 50 and 70 cm.

As used herein, the word "chip" can encompass many configurations of a silicon die or a packaged chip. The silicon die for example can have metalized bumps to facilitate the direct connection of the wire ends of an antenna to form a transponder or tag device. A package chip can include various structures such as a tape automated bonding module, a chip module, a flip chip module, a lead frame, a chip carrier, a strap, an interposer or any form of packaging to facilitate transponder manufacturing.

The conventional method to produce an inlay site containing a high frequency RFID chip and an antenna embedded into a multi-layer substrate and connected to the terminal areas of the RFID chip, is to embed a wire conductor into the top substrate layer in the direction of the RFID chip residing in a recess and supported by a lower substrate layer, then to guide the wire conductor over the first terminal area of the RFID chip, continue the embedding process by countersinking the wire conductor into the top substrate layer to form an antenna with a given number of turns and then guiding the wire conductor over the second terminal area and finally embedding the wire conductor again into the top substrate layer before cutting the wire to complete the high frequency transponder site. In the next stage of the production process the wire ends passing over the terminal areas are interconnected by means of thermal compression bonding.

An array of transponder sites may be formed on the top substrate layer and the additional layers of substrate form the resulting inlay, for further processing by security printers, contactless smart card and electronic passport manufacturers.

For the purpose of clarity, it is necessary to distinguish between the process of embedding a wire conductor into a substrate layer and the process of placing a wire conductor onto a substrate layer, as well as the apparatus used to implement the procedures.

The process of wire embedding (or scribing) involves the countersinking of a wire conductor into the surface of a substrate. The process of wire placement involves the adhesion of a self-bonding coated wire conductor to the surface of a substrate.

The wire embedding apparatus is an ultrasonic wire guide tool, known as a Sonotrode, with a wire feed channel (capillary) passing through the centre of the wire guide tool. The wire conductor is fed through the wire guide tool, emerges from the tip, and by application of pressure and ultrasonic energy the wire conductor is rubbed into the substrate, resulting in localised heating of the wire conductor and subsequent sinking of the wire conductor into the substrate material during the movement of the wire guide tool.

The wire placement apparatus is also an ultrasonic tool similar in function to an ultrasonic horn which heats the wire to form an adhesion with a substrate.

U.S. Pat. No. 6,698,089 ("089"), incorporated by reference in its entirety herein, discloses device for bonding a wire conductor. Device for the contacting of a wire conductor (113) in the course of the manufacture of a transponder unit arranged on a substrate (111) and comprising a wire coil (112) and a chip unit (115), wherein in a first phase the wire conductor (113) is guided away via the terminal area (118, 119) or a region accepting the terminal area and is fixed on the substrate (111) relative to the terminal area (118, 119) or the region assigned to the terminal area by a wire guide and a portal, and in a second phase the connection of the wire conductor (113) to the terminal area (118,119) is effected by means of a connecting instrument (125). Attention is directed to the figures and descriptions of FIGS. 1-3 which show a tool for embedding a wire conductor on a substrate. More particularly, FIG. 1 shows, in a schematic representation, the wiring of a wire conductor 20 on a substrate 21 by means of a wiring device 22 with a wire guide 23 which is subjected to the action of ultrasound.

The wiring device 22 represented in FIG. 1 is designed to be capable of being displaced along three axes and is subjected to the action of ultrasound which stimulates the wire guide 23 to execute oscillating transverse movements (arrow 24), which in the example represented in FIG. 1 are aligned perpendicular to a wiring plane 28 spanned by lateral edges 25, 26 of a substrate surface 27.

For the purpose of wiring, the wire conductor 20 is moved out of a wire-guide nozzle 30 while executing a continuous advancing movement in the direction of the arrow 29, whereby at the same time the wire guide 23 executes a wiring movement 29 which extends parallel to the wiring plane 28 and which in FIG. 1 can be retraced from the course of the wire-conductor section already wired on the substrate 21. On this wiring movement, which extends in the region of the front lateral edge 25 in the direction of the arrow 29, the oscillating transverse movement 24 is superimposed. This results in an impinging or impacting of the wire-guide nozzle 30 on the wire conductor 20 which is repeated in rapid succession corresponding to the ultrasonic frequency, leading to a compression and/or displacement of the substrate material in the region of a contact point 32.

FIG. 2 shows in a sectional representation, which corresponds roughly to the course of the line of intersection II-II indicated in FIG. 1, the embedded arrangement of the wire conductor 20 in the substrate 21. The substrate represented here is a PVC sheet, whereby for the purpose of embedding the wire conductor 20 the wire conductor is subjected via the wiring device 22 to, for example, an ultrasonic power output of 50 W and an ultrasonic frequency of 40 kHz. The contact force with which the wire-guide nozzle 30 is caused to abut the substrate surface 27 may, in the case of the aforementioned substrate material, lie in the range between 100 and 500 N. As is evident from the representation according to FIG. 2, in a test which was carried out by adjusting the aforementioned parameters an embedding of the wire conductor 20 into the substrate 21 was obtained substantially by virtue of a compression of the substrate material in a compression region 33 of the substrate material which here is crescent-shaped.

FIG. 3 shows the wiring device 22 in an individual representation with an ultrasonic generator 34 which is arranged coaxially with respect to the wire guide 23 and is rigidly connected to the latter in a connecting region 35. Overall the wiring device 22 represented in FIG. 3 is of rotationally symmetrical construction. The wire guide 23 comprises a central longitudinal bore 36 which in the region of the wire-guide nozzle 30 merges with a wire capillary 37 which in comparison with the longitudinal bore 36 has a narrowed diameter that is matched to the diameter of the wire conductor 20. The wire-guidance capillary 37 serves primarily to be able to align the wire conductor exactly in the wiring plane 28 (FIG. 1).

Although not represented in any detail in FIG. 3, the wire guide 23 may be equipped with a wire-severing instrument and a wire-advancing instrument Further attention is directed in the 089 patent to the following figures and descriptions. Generally, FIGS. 4-7 show card modules and coils formed by the tool. More particularly, FIG. 4 shows a wire conductor 20 which, for the purpose of forming a coil 41 which in this case takes the form of a high-frequency coil, is wired on a substrate 42. The coil 41 here has a substantially rectangular configuration with an initial coil region 43 and a final coil region 44 which are guided away via a window-shaped substrate recess 45. In this case the initial coil region 43 and the final coil region 44 are in parallel alignment with a main coil strand 46 which they accept between them in the region of the substrate recess 45. In the course of the ultrasonic wiring of the wire conductor 20 already elucidated in principle with reference to FIG. 1 the ultrasonic loading of the wire conductor 20 is interrupted while the latter is being guided away via the substrate recess in the course of the wiring operation, in order on the one hand to ensure no impairment of the alignment of the wire conductor 20 in an unrestrained region 47 between the recess edges 48, 49 located opposite one another and on the other hand in order to rule out stressing of the connection between the wire conductor 20 and the substrate 42 in the region of the recess edges 48, 49 by tensile stresses on the wire conductor 20 as a consequence of ultrasonic loading.

FIG. 5 shows, in a configuration that is modified in comparison with FIG. 4, a coil 50 with an initial coil region 51 and a final coil region 52 which are guided, angled in relation to a main coil strand 53, into an interior region of the coil 50. The coil 50 is arranged on a substrate 55 which comprises a substrate recess 56 in the interior region 53 of the coil 50. In order to be able to guide away both the initial coil region 51 and the final coil region 52 via the substrate recess 56, in the case of the configuration represented in FIG. 5 the final coil region 52 has to be guided away beforehand in a crossing region 57 via the main coil strand 44. In order in this case to prevent damage to or a partial stripping of the wire conductor 20, similarly as in the region of the substrate recess 56 the ultrasonic loading of the wire conductor 20 is interrupted in the crossing region 57. Furthermore, the wire guide 23 is slightly raised in the crossing region 57.

FIG. 6 shows, in a view of the substrate 55 corresponding to the course of the line of intersection VI-VI in FIG. 5, the placement of a chip unit 58 in the substrate recess 56, wherein terminal areas 59 of the chip unit 58 are caused to abut the initial coil region 51 and the final coil region 52.

FIG. 7 shows the subsequent connection of the terminal areas 59 of the chip unit 58 to the initial coil region 51 and to the final coil region 52 by means of a thermode 60 which under the influence of pressure and temperature creates a connection by material closure between the wire conductor 20 and the terminal areas 59, as an overall result of which a card module 64 is formed.

In the case of the chip unit 58 represented in FIGS. 6 and 7 it may also be a question, as in all other remaining cases where mention is made of a chip unit, either of an individual chip or of a chip module which, for instance, comprises a chip which is contacted on a chip substrate or even a plurality of chips. Furthermore, the connection represented in FIGS. 6 and 7 between the coil 50 and the terminal areas 59 is not restricted to the connection to one chip but applies generally to the connection of electronic components comprising terminal areas 59 to the coil 50. In this case it may be also a question, for example, of capacitors.

Furthermore, it becomes clear from FIGS. 6 and 7 that the substrate recess 56 is so dimensioned that it substantially accepts the chip unit 58. With a view to simplifying the alignment of the terminal areas 59 of the chip unit 58 in the course of the placement of the chip unit 58 preceding the actual contacting, the chip unit 58 may be equipped on its contact side 61 comprising the terminal areas 59 with an alignment aid 62 which here is constructed in the manner of a bridge. The alignment aid 62 is dimensioned so as to correspond to the spacing which the initial coil region 51 and the final coil region 52 have from one another in the region of the substrate recess 56 (FIG. 5).

Further attention is directed in the 089 patent to the following figure and description. Generally, FIG. 12 shows a modified wiring device. More particularly, FIG. 12 shows, in a modification of the wiring device 22 represented in FIG. 3, a wiring device 91 which, like the wiring device 22 comprises an ultrasonic generator 34. As distinct from the wiring device 22, there is no wire guide fastened to the connection region 35 of the ultrasonic generator 34 but rather a vibrating punch 92 which, as represented in FIG. 12, serves to subject the wire conductor 20 which is guided between a profiled end 93 and the surface of the substrate 21 to the action of mechanical vibrations extending in the longitudinal direction of the vibrating punch 92 and induced by ultrasound. In order in this case to enable reliable guidance of the wire conductor 20, the profiled end 93 is provided with a concave recess which is not represented in FIG. 12 in any detail and which enables partial encompassing of the wire conductor 20.

As distinct from the wiring device 22 represented in FIG. 3, on the wiring device 91 a wire guide 94 is provided which, in the case of the embodiment example represented here, is formed from a guidance tube 95 arranged laterally on the ultrasonic generator 34 with an elbow nozzle 96 which is formed in the direction of the profiled end 93 and which enables lateral supply, here directed obliquely downwards, of the wire conductor 20 in the direction of the profiled end 93. Hence, as represented in FIG. 12, the wire conductor 20 can be guided between the profiled end 93 of the vibrating punch 92 and the surface of the substrate 21 in order to enable the previously described connection to, or alternatively wiring on, or in, the surface of the substrate 21.

Departing from the representation in FIG. 12, it is also possible to provide the wire guide on the wiring device 91, decoupled from the ultrasonic generator 34, in order where necessary to enable vibration-free supply of the wire conductor.

In the case of the embodiment example represented in FIG. 12 the wiring device comprises a wire coil 99 which is capable of rotating about a winding axis 98 arranged transverse to the punch axis 97 and which serves to supply the wire conductor 20 into the wire guide 95.

In order to enable arbitrary wiring of the wire conductor 20 on the surface of the substrate 21, the wiring device 91 comprises, coaxially with respect to the punch axis 97, a pivotal axis 100.

Further attention is directed in the 089 patent to the following figure and description. Generally, FIG. 13 show a chip card with a transponder unit formed from a wire coil and a chip unit. FIGS. 14 and 15 are more detailed views. More particularly, FIG. 13 shows a chip-card inlet (sic, "inlet" is the German word for "inlay") 110 which, with a view to the manufacture of a chip card by way of end product which is not represented in any detail here, is provided with bilateral surface layers which as a rule are applied onto the chip-card inlet in the form of laminated layers covering the surface.

The chip-card inlet 110 consists here of a coil substrate 111 formed from plastic material, onto which a wire coil 112 is applied with the aid of wire-laying technology. To this end a wire conductor 113 is wired on the surface of the coil substrate 111 by means of a wiring instrument which is not represented in any detail in FIG. 13 and is partially embedded into the coil substrate 111 by ultrasonic loading, as can be gathered from FIG. 14.

As is evident furthermore from the representation according to FIG. 13, in the coil substrate 111 a recess 114 is provided which serves to accept a chip unit constituted here by an individual chip 115. The chip unit may, as in the present case, be constituted merely by the chip 115. However, it is further possible for the chip unit to be formed from a so-called "chip module" which accepts one or even several cased chips.

As is further evident from FIG. 13, the wire conductor 113 which is wired for the purpose of forming the wire coil 112 on the coil substrate 111 is contacted with wire ends 116, 117 on an assigned terminal area 118 and 119, respectively, of the chip 115.

A process for implementing the contacting of the wire ends 116, 117 with the terminal areas 118, 119 of the chip 115 will be elucidated in more detail below with reference to FIG. 14. The process represented in detail in FIG. 14 is effected in two successive phases, which here for the purpose of differentiation are denoted by I and II. In the phase designated by I the wire end 116 illustrated here is fixed on the coil substrate 111, whereby simultaneously as a consequence of the aforementioned wiring process for applying the wire conductor 113 onto the surface of the coil substrate 111 the wire conductor 113 is guided away via the chip 115 that is received in the recess 114. With a view to implementing the process represented in FIG. 14, the coil substrate 111 is arranged on a table 120 together with the chip 115 received in the recess 114.

By way of wiring instrument, in the case of the process example represented in FIG. 14 use is made of an ultrasonic instrument 121 which with a vibrating punch 122 embeds the wire conductor 113 which is continuously guided out of a wire guide 123 into the surface of the coil substrate 111 and thereby simultaneously executes a horizontal movement 124 on the surface of the coil substrate 111. This application of the wire conductor 113 on the surface of the coil substrate 111, which is described by the term wirings, is firstly effected in the region designated by Ia to the left of the recess 114, subsequently the wire conductor 113 is guided away with the wire guide 123 via the chip 115 which is arranged in the recess 114, in order finally to continue with the fixation of the wire conductor 113 on the right-hand side of the recess 114 in the region headed by Ib by means of ultrasonic loading of the wire conductor via the vibrating punch 122. Although when use is made of the ultrasonic instrument 121 described above for wiring the wire conductor 113 on the coil substrate 111 a fixation of said wire conductor arises extending substantially over the entire length of the wire conductor 113 on the coil substrate 111, in order to realise the principle of the process it is sufficient if a fixation of the wire conductor 113 on the coil substrate 111 is effected merely at two points to the left and right of the recess 114, in order to achieve the linear alignment of the wire conductor 113 represented in FIG. 14 via the terminal areas 118, 119 of the chip 115.

After the wire conductor 113 is located in the position spanning the assigned terminal area 118 of the chip 115, in the phase denoted by II the connection of the wire conductor 113 to the terminal area 118 is effected. To this end use is made, in the process example represented in FIG. 14, of another ultrasonic instrument 125 which, as is evident in particular from FIG. 15, comprises a profiled end 126 pertaining to a vibrating punch 127 and provided with a concave recess.

The process described above with reference to FIGS. 14 and 15 also offers the possibility, by appropriate choice of the points of fixation of the wire conductor on the substrate, of guiding the wire conductor away diagonally via the terminal areas, in order to increase the overlap between the wire conductor and the terminal areas. Also, several chips or other elements arranged in series on, or in, a substrate can be connected by means of the wire conductor in the manner represented in FIG. 14.

Furthermore, FIG. 15 shows clearly that, in contrast with the vibrational loading 128 induced by ultrasound which is effected in the longitudinal direction of the vibrating punch 122 of the ultrasonic instrument 121, the vibrational loading 129 of the vibrating punch 127 induced by ultrasound is effected transverse to the longitudinal direction of the wire conductor 113 and parallel to the surface of the coil substrate 111. On this vibrational loading 128 a slight contact pressure 130 is superimposed, so that the wire conductor 113 which is received in guided manner in the profiled end 126 of the vibrating punch 127 is moved back and forth in oscillating manner under pressure in the region of the terminal area 118 above the latter. On the one hand this results in any oxide skins that may be present on the terminal area 118 being ripped open and eroded, on the other hand a welding subsequently results, given appropriately high or increased contact pressure 130, of the wire conductor 113, which here is formed from copper, to the aluminum terminal area 118. In case the wire conductor 113 is provided with an external insulation the latter can also be removed by the oscillating movement back and forth in the region of the terminal area 118, so that subsequently the metallic connection previously described between the wire conductor, which immediately beforehand is still protected against oxidation by the insulation, and the terminal area becomes possible.

In the coil substrate 111 represented in FIGS. 14 and 15 the recess 114 is arranged so as to be larger than the corresponding dimensions of the chip 15, so that a circumferential gap 130 results between the chip 115 and the edges of the recess 114. By this means a virtually "floating acceptance" of the chip 115 in the recess 114 is possible, whereby, although said chip is substantially defined in its location relative to the coil substrate 111, it is able to execute minor relative movements. This results in the advantage that, by virtue of the laminating operation described in the introduction for application of the bilateral surface layers onto the coil substrate 111, the chip can at least partially avoid the pressure loads associated with the laminating operation and consequently the risk of damage to the chip in the course of the laminating operation is significantly reduced.

In order also in the case of the "floating acceptance" of the chip in the recess 114 described above to be able to carry out an exact positioning of the wire conductor 113 on the terminal area 118, the wire conductor 113 can be tracked via a corresponding transverse-movement axis 131 of the ultrasonic instrument 125.

Although with reference to the process example represented in FIGS. 14 and 15 two different ultrasonic instruments 121 and 125 were mentioned in the foregoing description, there is also the possibility, given appropriate design of the ultrasonic instrument 121, of making use of the latter both for the wiring and/or fixation of the wire conductor on the surface of the coil substrate 111 and for the connection of the wire conductor 113 to the respectively assigned terminal area 118 or 119.

Further attention is directed in the 089 patent to the following figure and description. Generally, FIGS. 16 and 17 show an alternate procedure for application and contacting of the chip unit. More particularly, A way of proceeding that is slightly varied in comparison with FIGS. 14 and 15 is represented in FIGS. 16 and 17, wherein only after fixation of the wire conductor 113 on the surface of the coil substrate 111 on both sides of the recess 114 is a chip 132 introduced into said recess. In order simultaneously with the introduction of the chip 132 into the recess 114 to enable a positioning that is suitable for the subsequent contacting of the wire conductor 113 with an assigned terminal area 133 of the chip 132, the latter is equipped on its contact side 134 with bridge-type alignment aids 135, in each instance arranged adjacent to a terminal area 133, which provide for correct relative positioning via guide bevels 136.

FIG. 17 shows, in addition, a thermode instrument 137 which can be employed as an alternative to the ultrasonic instrument 125 by way of a connecting instrument which enables a connection of the wire conductor under pressure and temperature loading to the assigned terminal area 133. With both of the connection processes represented in FIGS. 14, 15 and 17 there is, in principle, the possibility of establishing the connection between the wire conductor and the terminal areas by a superimposition of ultrasonic loading and temperature loading, for example by means of a heat-able ultrasonic instrument.

Further attention is directed in the 089 patent to the following figure and description. Generally, FIG. 20 shows an alternative to FIG. 13. More particularly, FIG. 20 finally shows, in a variant of the representation according to FIG. 13, the possibility of applying the process described above also for the direct contacting of the wire conductor 113 with assigned terminal areas 118 and 119 of the chip 115 if the chip 115 is not arranged in a recess but rather on the surface of a substrate 143. In the case of the substrate 143 represented in FIG. 20 it may be a question, for example, of a paper substrate or of any other substrate. Conforming with the process elucidated with reference to FIGS. 14 and 15, here too on both sides of an acceptance region or arrangement region 144 for the chip 115 a fixation is provided of the wire conductor 113 into the surface regions of the substrate 143, here designated in simplified manner by 1a and 1b.

The wire embedding technology as described in U.S. Pat. No. 6,698,089 and European Patent EP 0 880 754 B1 is the process used to embed insulated copper wire into a substrate, to form an antenna and to interconnect the wire ends to a high frequency RFID chip.

U.S. Pat. No. 5,809,633, incorporated by reference in its entirety herein, discloses method for producing a smart card module for contactless smart cards. A method for producing a smart card module includes bonding one end of a thin wire onto a first contact zone of a semiconductor chip. The wire is guided in a plurality of turns forming an antenna coil. The wire is bonded onto a second contact area of the semiconductor chip. The wire turns of the antenna coil and the semiconductor chip are placed on a carrier body. More particularly, a method for producing a smart card module, comprises bonding one end of a thin wire onto a first contact zone of a semiconductor chip; guiding the wire in a plurality of turns forming an antenna coil; bonding the wire onto a second contact area of the semiconductor chip; and placing the wire turns of the antenna coil and the semiconductor chip on a carrier body. The guiding step may be performed with a bonding head. The semiconductor chip may be placed in a recess in the carrier body and suspending the semiconductor chip from bonds at the ends of the wire, while carrying out the step of placing the wire turns of the antenna coil and the semiconductor chip on the carrier body.

U.S. Pat. No. 6,626,364, incorporated by reference in its entirety herein, discloses a high speed system for embedding wire antennas in an array of smart cards. An apparatus for embedding an electrical wire antenna in a non-electrically conductive substrate so as to communicate with an electronic chip mounted on the substrate comprises: a source of antenna wire; an ultrasonic actuator to receive a run of the antenna wire from said source thereof, said ultrasonic actuator having a tip that is adapted to oscillate at an ultrasonic frequency to melt the non-conductive substrate so that said run of antenna wire can be installed there within; and an actuator positioning assembly coupled to said ultrasonic actuator for causing said actuator to move towards and away from the non-conductive substrate by which to enable the tip of said ultrasonic actuator to melt the substrate. The ultrasonic actuator is connected to receive a supply of ultrasonic energy by which to cause the tip thereof to oscillate at said ultrasonic frequency so as to melt the non-conductive substrate whereby said run of antenna wire can be installed there within. The tip of said ultrasonic actuator includes a wire feed channel extending there through, said run of antenna wire being fed from said source thereof through said wire feed channel to be installed within the non-conductive substrate when the non-conductive substrate is ultrasonically melted by said tip. The tip of said ultrasonic actuator has a concave end for ultrasonically melting the non-conductive substrate, said wire feed channel extending through said tip to said concave end thereof.

US Patent Publication 2004/0155114, incorporated by reference in its entirety herein, discloses a method for producing a contactless chip card and chip card produced according to said method. The invention relates to a method for producing a transponder, especially a contactless chip card comprising at least one electronic component (chip module) and at least one antenna; the at least one electronic chip component being disposed on a non-conducting substrate that serves as a support for the component. The at least one antenna is also disposed on a non-conducting substrate, the at least one electronic component being applied to a first substrate and the antenna on a second substrate. The entire circuit is then produced by joining the individual substrates so that they are correctly positioned relative to each other. The components are contacted once the different substrates have been joined by means of auxiliary materials such as solder or glue, or without auxiliary materials by micro-welding. The non-conducting substrates form a base card body.

German Patent Publication DE 196 16 424 A1, incorporated by reference in its entirety herein, discloses connecting wire ends of an antenna to ball contacts a chip. The embedded wire in the form of an antenna wire is embedded into the plastic film in such a way that the terminal ends are drawn over the ball contacts of the chip. The wires are slightly stretched over the chip. Particularly suitable as embedded wires are silver-plated copper wires that are welded to the gold in the ball contacts by means of thermo-compression or glued using silver conductor paste.

German Patent Publication DE 20 2005 016382, incorporated by reference in its entirety herein, discloses wire embedding mechanism for producing an antenna. Wire embedding mechanism to produce transponders with at least one antenna on a surface (1a) of a substrate (1) at a minimum with an ultrasonic sonotrode (13, 18) with an integrated wire guide facility (14) to feed in an antenna wire (15) onto the surface (1a) of the substrate (1) and a heating apparatus (19) to connect the antenna wire (15) with the surface (1a) of the substrate (1), characterized by the arrangement that between the ultrasonic sonotrode (18) and the adjoining heating apparatus (19) a lockable clamp element (20) defines the alignment of the free ends (15c) of the antenna wire (15) with respect to the heating apparatus (19). The described wire embedding mechanism uses a capillary (fine bore) to feed the antenna wire through the ultrasonic sonotrode and to embed the wire into the substrate. The process of producing a transponder on a substrate is as follows: In the first step the wire is connected to the first terminal area by means of thermal compression bonding, in the second step, the wire is embedded into the substrate to form an antenna and in the third step the wire is connected to the second terminal area by means of thermal compression bonding.

International Patent Application PCT/DE2005/001932, incorporated by reference in its entirety herein, discloses in claim 1 a device for embedding wires for a transponder unit on substrates (6), having an ultrasonic horn (12; 119) for embedding the wire (4), and having an ultrasonic converter (10; 120) for application of ultrasound to the ultrasonic horn, characterized in that the wire (4) can be supplied axially to the embedding device (2; 118). The embedding device as in claim 1, wherein a passage channel (14, 15, 44, 54) is provided for guidance of the wire (4) in the embedding device (2; 118), and passes coaxially through it. The embedding device as cited in claims 1 to 12, wherein ultrasound is introduced into the wire (4) in the horizontal direction.

U.S. Pat. No. 6,310,778 discloses IC board module for producing an IC board and process for producing an IC board. An IC card module (20) for producing an IC card (118) having at least one coil (46) and at least one chip (23) for the formation of a transponder unit, with the chip and the coil being connected together by way of a module carrier (21) which renders possible not only an electrically conductive connection between the chip and the coil, but also an electrically conductive connection with an external contact face (38) of the module carrier and the chip, wherein the IC card module (20) has a retaining device (41) which is at a distance from the external contact face (38) by an offset R and projects laterally beyond the external contact face, and also a method for producing an IC card with use of such an IC card module.

U.S. Pat. No. 6,288,443 discloses chip module and manufacture of same. A chip module (37) includes a substrate (12) and at least one chip (38) arranged on the substrate, wherein the chip 5 (11) is contacted via its terminal surfaces onto connecting leads (14, 15) of the substrate (12) and has a thickness d which is reduced compared to its original thickness D as a result of a removal of material on its rear side (39).

U.S. Pat. No. 6,233,818 discloses method and device for bonding a wire conductor. Process and device for the contacting of a wire conductor (113) in the course of the manufacture of a transponder unit arranged on a substrate (111) and comprising a wire coil (112) and a chip unit (115), wherein in a first phase the wire conductor (113) is guided away via the terminal area (118, 119) or a region accepting the terminal area and is fixed on the substrate (111) relative to the terminal area (118, 119) or the region assigned to the terminal area, and in a second phase the connection of the wire conductor (113) to the terminal area (118,119) is effected by means of a connecting instrument (125). A process for the contacting of a wire conductor in the course of the manufacture of a transponder unit arranged on a coil substrate and including a wire coil with wire windings for forming the wire coil on a surface plane of the substrate and a chip unit having a terminal area, the process comprises the steps of in a first phase guiding the wire conductor over and away from a terminal area or a region accepting the terminal area and fixing the wire conductor on the substrate relative to the terminal area or the region assigned to the terminal area; and in a second phase effecting a connection of the wire conductor to the terminal area with a connecting instrument and the wire conductor is connected while being fixed on the coil substrate and extending in parallel to the surface plane of the windings of the wire coil. An ultrasonic instrument is used both as the connecting instrument for the purpose of connecting the wire conductor to the terminal area and for the purpose of arranging the wire coil on the substrate.

U.S. Pat. No. 6,142,381 discloses contact or contactless chip card with brace. A chip card for contact access and contactless access to a chip arranged in a chip module, wherein the chip module is arranged in a recess (59) of a card body (49) such that outer contact surfaces (51) of the chip module are arranged at the surface (60) of the card body (49) and inner contact surfaces (53) of the chip module are connected to conductor ends (55, 56) of a coil (57) arranged in the card body to form a transponder unit, where the coil has the form of a wire coil (57) and the depth (t) of the recess (59) which accommodates the chip module is such that wire ends (55, 56) arranged in the region of the recess (59) have a contact flattening (63) formed by the machining process for the formation of the recess (59).

U.S. Pat. No. 6,088,230 discloses procedure for producing a chip mounting board and chip-mounting board thus produced. Procedure for producing a transponder unit (55) provided with at least one chip (16) and one coil (18), and in particular a chip card/chip-mounting board (17) wherein the chip and the coil are mounted on one common substrate (15) and the coil is formed by installing a coil wire (21) and connecting the coil-wire ends (19, 23) to the contact surfaces (20, 24) of the chip on the substrate. The chip and the coil are mounted on one common substrate and the coil is formed by installing a coil wire and connecting the coil-wire ends to the contact surfaces of the chip on the substrate. As a first step prior to the installation of the coil wire, one coil-wire end is connected to a first contact surface of the chip, the coil wire is then installed to form the coil, whereupon the leading end of the coil wire is connected to a second contact surface of the chip, while in the process of the coil-wire installation the coil wire (21) is bonded to the substrate at least in some locations.

Glossary & Definitions

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

chip As used herein, the word "chip" can encompass many configurations of a silicon die or a packaged chip. The silicon die for example can have metalized bumps to facilitate the direct connection of the wire ends of an antenna to form a transponder or tag device. A package chip can include various structures such as a tape automated bonding module, a chip module, a flip chip module, a lead frame, a chip carrier, a strap, an interposer or any form of packaging to facilitate transponder manufacturing.

inlay An inlay substrate typically has a plurality, such as array of transponder sites on a substrate which matches the position of the data or graphics on a printed sheet or holder/cover page of a smart card or electronic passport respectively.

A secure inlay is similar to a conventional inlay but with additional features such as an additional RFID chip on the transponder site storing information about the production processes in the value chain as well as having personalization features integrated into the inlay such as a hologram, an anti-skimming material or security codes embedded into the inlay.

ISO 7810 Defines the size and shape of cards. All credit cards and debit cards, and most ID are the same shape and size, as specified by the ISO 7810 standard. Smart cards follow specifications set out in ISO 7816, and contactless smart cards follow the ISO 14443 specification.

ISO 7816 Regarding smart card, ISO7816 defines specification of contact interface IC chip and IC card.

ISO 10536 Defines the operation of close coupling for contactless cards

ISO 14443 ISO 14443 RFID cards; contactless proximity cards operating at 13.56 MHz in up to 5 inches distance. ISO 14443 defines the contactless interface smart card technical specification.

ISO 15693 ISO standard for contactless integrated circuits, such as used in RF-ID tags. ISO 15693 RFID cards; contactless vicinity cards operating at 13.56 MHz with up to 20 inches of read range. (ISO 15693 is typically not used for financial transactions because of its relatively long range as compared with ISO 14443).

RFID Short for "Radio Frequency Identification". An RFID device interacts, typically at a limited distance, with a "reader", and may be either "passive" (powered by the reader) or "active" (having its own power source, such as a battery).

tag As used herein, "tag" refers to a transponder or transponder site on an inlay . . . and may be distinguished from "inlay" . . . .

transponder As used herein, a transponder is an RFID chip (either passive or active) connected to an antenna.

Long range classification includes RFID systems that operate 866-868 MHz (EU), 915 (US) 2.5 GHz and 5.8 GHz.

UHF Tags

Passive UHF RFID systems typically communicate using frequencies at 866 MHz and 915 MHz with a maximum read range of 10 meters (approximately 30 feet) under ideal conditions. However, this does not preclude UHF from near field and near contact applications as UHF systems can be easily tailored to meet lower range requirements. This can be accomplished by reducing power at the reader, reducing the size of the reader antenna, and/or reducing the size of the tag antenna. Ideally, the antenna should have a physical length approximately one-half wavelength of the chip's operating frequency.

By varying the impedance of the antenna (i.e. adding additional conductor portions adjacent to the elements of the antenna), the resonant frequency may be adjusted to compensate for operating environment conditions.

BRIEF DESCRIPTION (SUMMARY) OF THE INVENTION

It is a general object of an embodiment of the invention to provide an improved, secure inlay.

It is a general object of an embodiment of the invention to provide improved techniques for fabricating inlays with transponders.

It is a general object of an embodiment of the invention to provide improved techniques for mounting an antenna wire to an inlay substrate, including embedding the wire in a surface of the substrate and adhesively placing the wire on the surface of the substrate. When the term "embedding" is used herein, it should be taken to include adhesively placing, if appropriate in the context (such as when describing mounting a self-bonding wire)—in other words, "embedding" may sometimes be used to mean "mounting" (which includes both "embedding" and "adhesively placing").

It is a general object of an embodiment of the invention to provide improved techniques for connecting an embedded wire to a chip module on an inlay.

Conventionally (in the prior art), an insulated wire conductor is bonded to the terminal area(s) of a chip using thermal compression bonding. This is a welding process in which the insulated wire conductor is bonded to the terminal area(s) of a chip by passing a current through a thermode which holds the wire conductor under force against the terminal area of the chip. The first impulse of current removes the insulation, while the second impulse results in the diffusion of the wire conductor with the terminal area of the chip.

According to an embodiment of the invention, generally, the bonding of an insulated wire to the terminal area of a chip is significantly improved upon, resulting in superior repetitive results when performing a pull test of the bonded wire to the terminal area of a chip at 90 degrees.

In the production of inlays, a problem is that the chip resides on a synthetic material which is not a well defined surface for bonding. Another problem is that the thickness of the insulation of the wire conductor depends on the grade of wire. To obtain a reasonable deformation of the wire conductor during the bonding process, a force between 1.8 and 2.5 Newton is required. However, the insulation between the wire conductor and the terminal area of the chip may not have evaporated during the thermal compression bonding process, resulting in an unreliable interconnection.

According to an embodiment of the invention, this quality issue is resolved by removing the insulation before bonding, by passing the wire conductor through a laser tunnel, before the wire conductor is directed to the ultrasonic wire guide tool. The laser tunnel can be driven by glass fiber connected to a multiplexing diode laser. The inner wall of the tunnel can be coated with a reflective material.

The position of the insulation removal can be defined and the length of wire conductor which passes from the laser tunnel to the ultrasonic wire guide tool can be measured. By using an un-insulated wire at the bond position the force required for the diffusion process can be reduced, and better controlled.

According to an embodiment of the invention, a method of forming an inlay comprising an antenna wire having two end portions and a site for a transponder chip, the transponder chip comprising two terminals, comprises: mounting the antenna wire to a surface of the substrate; and leaving the end portions of the antenna wire free-standing, as loops adjacent terminal areas of a site on the substrate for the transponder chip. Mounting the antenna wire may comprise embedding the wire in or adhesively placing the antenna wire on the surface of the substrate, and may comprise the application of ultrasonic energy the wire conductor.

The free-standing loops may be disposed in a plane which is substantially perpendicular to the surface of the substrate. Or, the free-standing loops may span slots adjacent to the site for the transponder chip.

The free-standing loops are repositioned to be substantially directly over the terminals of the transponder chip, in preparation for interconnection of the loops to the terminals of the transponder chip, then are bonded to the terminals. If a coated antenna wire is used, the coating is removed from at least a portion of the loops prior to bonding, either during mounting the antenna wire or after mounting the antenna wire.

According to another embodiment of the invention, a method of mounting an antenna wire to an inlay substrate and preparing end portions of the antenna wire for bonding to terminals of a transponder chip, comprises: providing an embedding tool; providing a wire guide tool, separate from the embedding tool for feeding wire to under an end of the embedding tool; at a point "a" on the surface of the substrate, commencing mounting the antenna by lowering the embedding tool down onto the surface of the substrate to urge the wire into the substrate; moving the embedding tool in a plane (x-y) parallel to the surface of the substrate a short distance sufficient to ensure embedding, to a point "b", and then stopping embedding and raising up the embedding tool; forming a first free-standing loop in the wire, between point "b" and a point "c", adjacent a first terminal area of the transponder chip; lowering the embedding tool and resuming embedding from the point "c" through points "d" and "e", to a point "f"; at the point "f", stopping embedding and raising up the embedding tool; forming a second free-standing loop in the wire, between the point "f" and a point "g", adjacent a second terminal area of the transponder chip; and moving the embedding tool in the plane (x-y) parallel to the surface of the substrate a short distance sufficient to ensure embedding, to a point "h", and then stopping embedding and raising up the embedding tool. At the point "h", the wire may be cut. After cutting the wire, the embedding tool may be moved to another inlay location on the substrate to form another antenna.

According to another embodiment of the invention, apparatus for mounting a wire to an inlay substrate comprises: a sonotrode having an end for mounting the wire; a rotary wire guide disposed adjacent the end of the sonotrode for feeding the wire o under the end of the sonotrode; and a cutting mechanism disposed adjacent the rotary wire guide for severing the wire. The mounting of the wire may comprise embedding the wire in the surface of the substrate, or adhesively placing the wire on the surface of the substrate. The wire may be a self-bonding wire.

According to another embodiment of the invention, a secure inlay comprises: a substrate; a main antenna coil; a first chip connected to the main antenna coil; and a second chip inductively coupled with its own smaller coil to the main antenna coil. The first chip comprises a passive RFID chip storing information about a user or bearer. The second chip comprises a passive RFID chip storing information pertaining to the manufacturing process, steps in the value chain from inlay to final product, personalization and activation. The first chip may comprise a contactless chip which has a unique identification code or secret key which is masked by the silicon provider, programmed by the substrate manufacturer or downloaded in encrypted form from a central database. The second chip may comprise a digital signature which can be used to verify that an e-passport was issued by a legitimate authority, and that it has not been altered.

A metallic, non-ferrous material may be disposed in a layer of the substrate for reducing coupling, in one direction. Microscopic metal filings may be disposed in a layer of the substrate for personalizing the inlay.

Other objects, features and advantages of the invention will become apparent in light of the following description thereof.

BRIEF DESCRIPTION OF THE DRAWINGS

Reference will be made in detail to embodiments of the disclosure, examples of which may be illustrated in the accompanying drawing figures (FIGS.). The figures are intended to be illustrative, not limiting. Although the invention is generally described in the context of these embodiments, it should be understood that it is not intended to limit the invention to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

Figure 1:
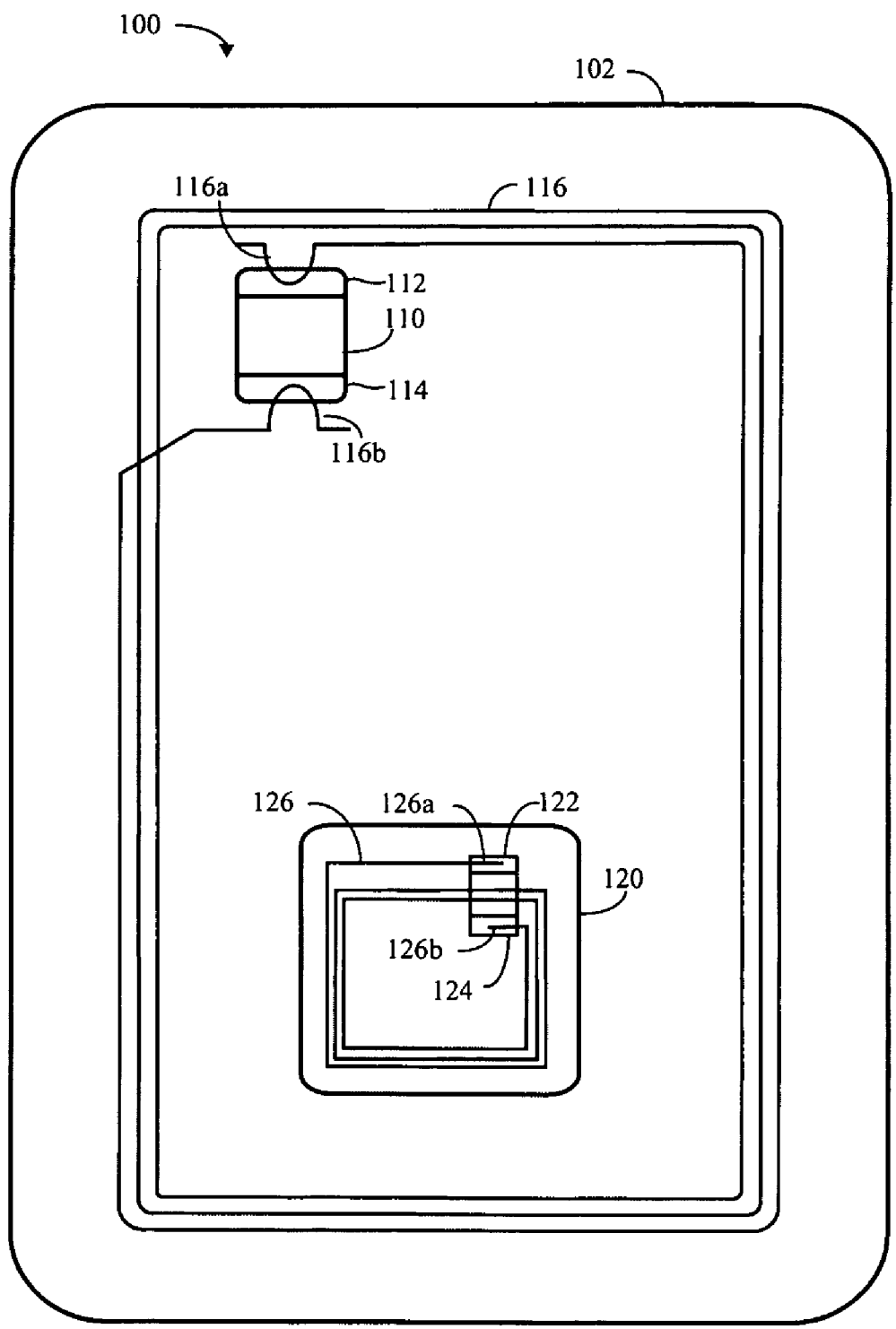

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

FIG. 1 is a plan (top) view of an inlay substrate having two RFID chips (also referred to as "transponders"), according to an embodiment of the invention.

Figure 2A:
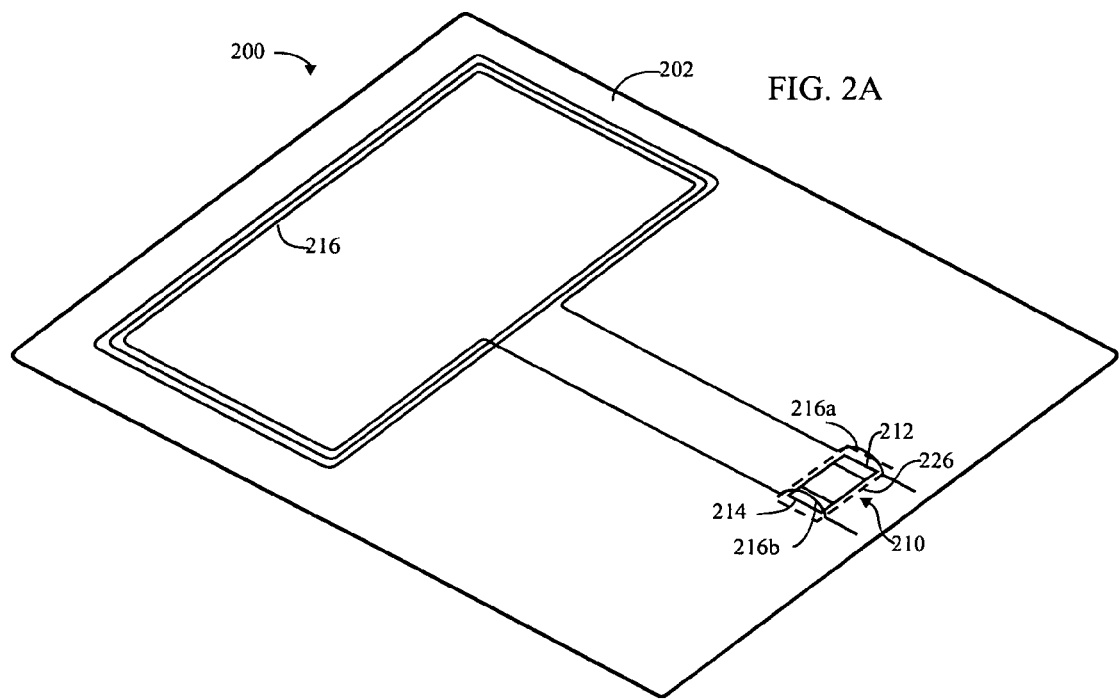

FIG. 2A is a perspective top view of an embodiment of a looping technique, according to the invention.

Figure 2B:
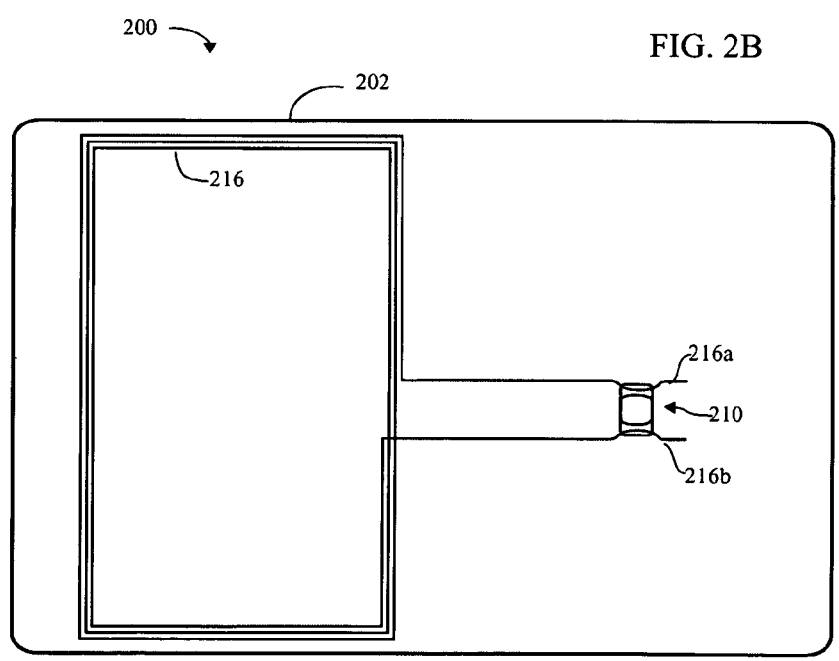

FIG. 2B is a top plan view of a further step in the embodiment shown in FIG. 2A, according to the invention.

FIG. 2C is a perspective top view of another embodiment of a looping technique, with the antenna wire passing over slots in the substrate, according to the invention.

FIG. 2D is a top plan view of a further step in the embodiment shown in FIG. 2C, according to the invention.

FIG. 3A is a side view of an embodiment of an embedding tool, according to the invention.

FIG. 3B is a more detailed view of the end of the embedding tool of FIG. 3A.

FIG. 3C is a cross-sectional view taken on a line C-C through FIG. 3A.

FIG. 4A is a cross-sectional view of a substrate having a wire embedded therein, and an end of the wire formed as a free-standing loop (such as in FIG. 2A), according to an embodiment of the invention.

FIG. 4B is an end view taken on a line 4B-4B through FIG. 4A.

FIG. 4C is a top view of the substrate shown in FIG. 4A.

FIG. 4D is a schematic illustration of forming loops at ends of an antenna wire which is mounted to (embedded in or place on) a substrate, illustrating an embodiment of a method, according to the invention.

FIG. 4E is a schematic illustration of re-positioning the loops of FIG. 4D over terminals of a transponder chip, according to the invention.

Figure 5:
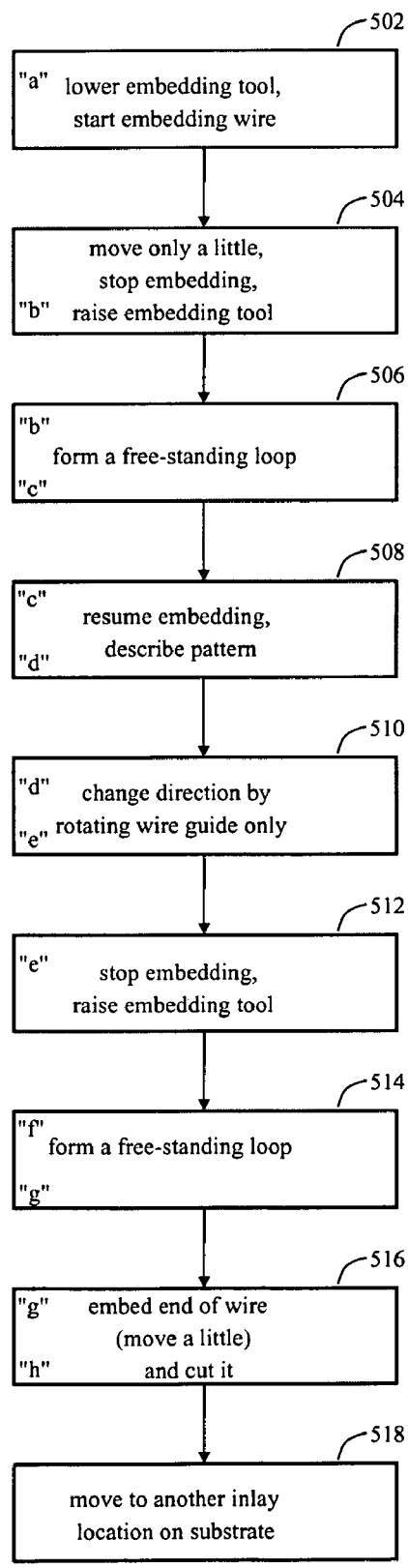

FIG. 5 is a flowchart illustrating describing steps associated with the method of described with respect to FIG. 4D, according to the invention.

Figure 6:
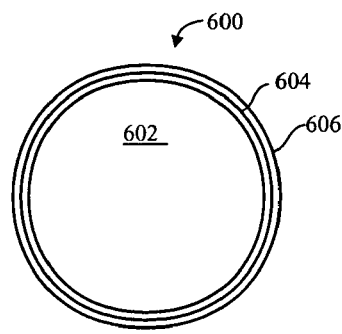

FIG. 6 is a cross-sectional view of a wire, with an additional adhesive coating, such as may be used in conjunction with the present invention.

Figure 7A:
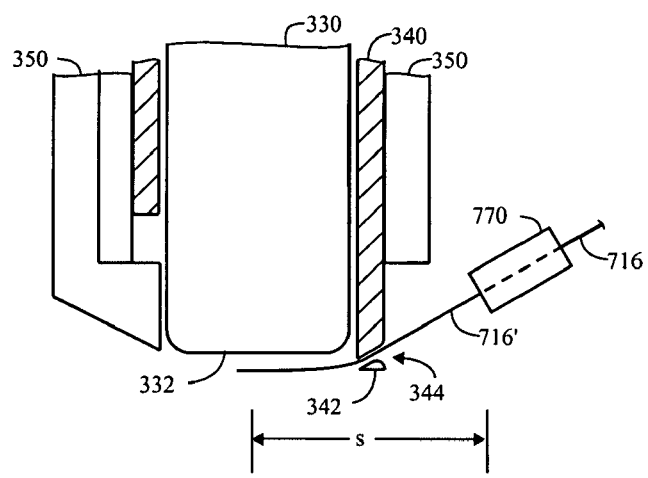

FIG. 7A is a cross-sectional view of a portion of an embedding tool (such as shown in FIG. 3B), with means for removing insulation from insulated wire during embedding, according to the invention.

Figure 7B:
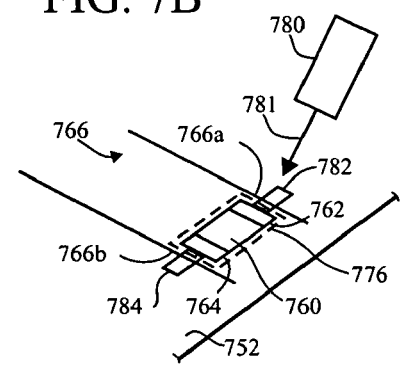

FIG. 7B is a perspective view of a portion of an inlay having the wire ends of an antenna pass over slots in the substrate (such as shown in FIG. 2C), with means for removing insulation from insulated wire after embedding (and after positioning the wire over the slot), according to the invention.

Figure 8:
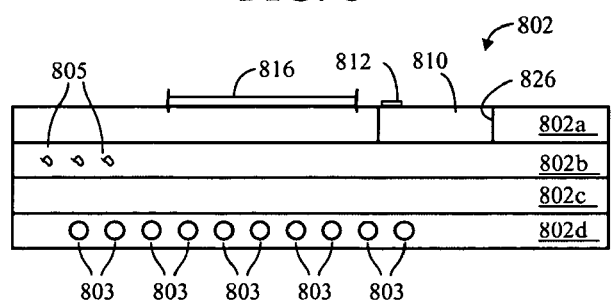

FIG. 8 is a cross-sectional view of a multi-layer inlay, according to an embodiment of the invention.

Figure 9A:
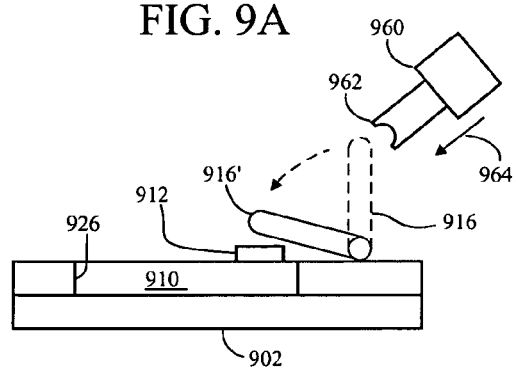

FIG. 9A is a cross-sectional view of an inlay with a chip and a wire being manipulated (repositioned) over a terminal of a transponder chip, according to an embodiment of the invention.

Figure 9B:
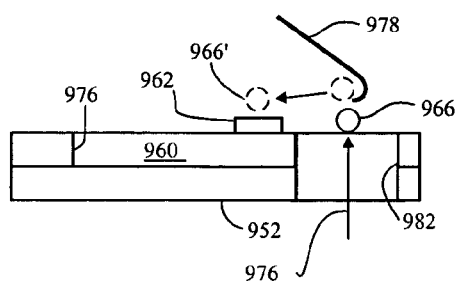

FIG. 9B is a cross-sectional view of an inlay with a chip and a wire passing over a slot (such as shown in FIG. 2C), being manipulated (repositioned) over a terminal of a transponder chip, according to an embodiment of the invention.

Figure 10:
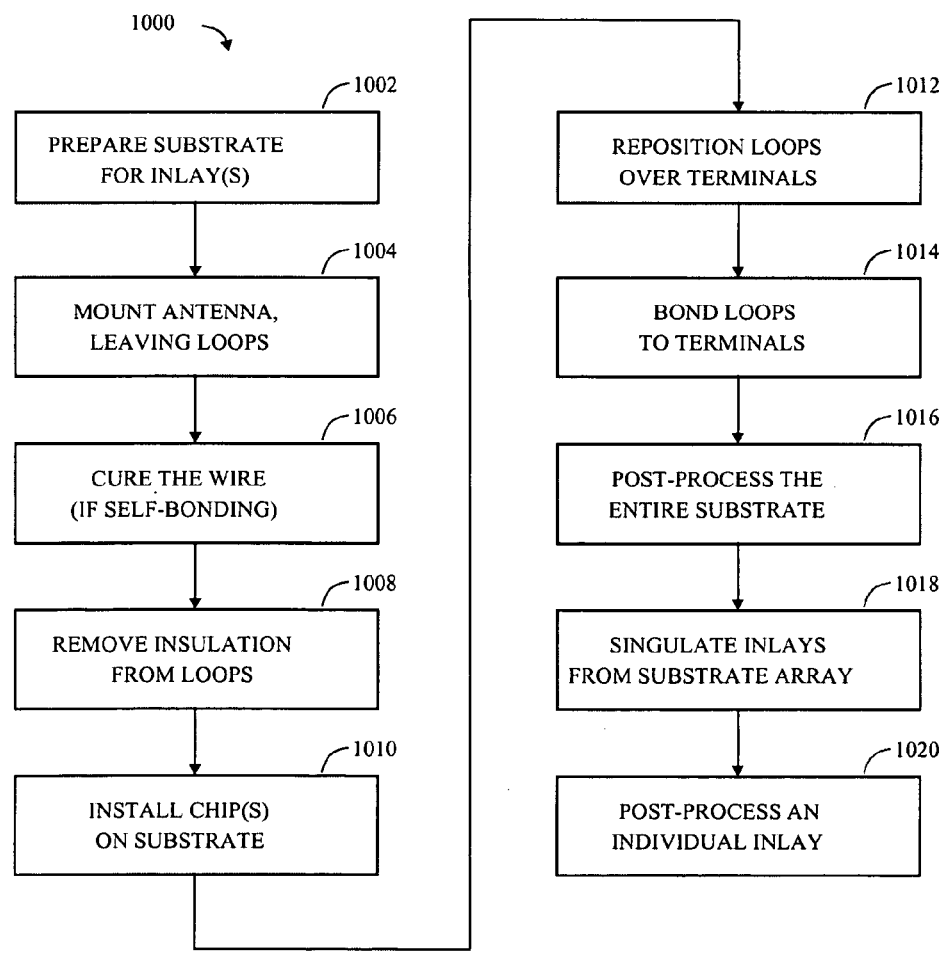

FIG. 10 is a diagram showing a manufacturing flow, according to an embodiment of the invention.

DETAILED DESCRIPTION OF THE INVENTION

Various "embodiments" of the invention will be discussed. An embodiment is an example or implementation of one or more aspects of the invention(s). Although various features of the invention may be described in the context of a single embodiment, the features may also be provided separately or in any suitable combination. Conversely, although the invention may be described herein in the context of separate embodiments for clarity, the invention may also be implemented in a single embodiment.

It should be understood that the phraseology and terminology employed herein is not to be construed as limiting, and is for descriptive purposes only.

The invention relates generally to secure inlays which may be single or multi-layer substrates containing HF (high frequency) and/or UHF (ultra-high frequency) radio frequency identification (RFID, transponder) chips and, more particularly, to techniques for mounting (including embedding in or positioning on) an antenna wire to the inlay substrate, and preparing end portions of the antenna wire for connecting to the terminals areas of a chip (such as an RFID transponder chip) or a chip module.

Various aspects, features, and embodiments of the invention are disclosed, including the aforementioned secure inlay itself, tools for embedding antenna wire in an insulating substrate, single and multi-layer substrates, anti-skimming techniques, techniques for personalizing an inlay, and others. These various aspects, features, and embodiments of the invention can often be implemented with one another, in various combinations.

The following description is generally presented in "sections", as follows:

| | |
|---|---|
| Section 1 | Secure Inlay Having A High Frequency (HF) Transponder And An Ultra High Frequency (UHF) Transponder |
| Section 2 | Techniques For Connecting Ends of Antenna Wire to Terminals of Transponder Chips or Chips Modules On An Inlay Substrate |
| Section 3 | Method And Apparatus For Embedding Antenna Wire In An Inlay Substrate |
| Section 4 | Additional Features, such as: Insulated, Self-Adhering (Self-Bonding) wire Insulation Removal Anti-skimming Tools For Repositioning Loops Production Flow Through Stations |

Nothing should be implied or inferred from the section headings, and various features of various embodiments of the invention may be interspersed between various sections. Also, various features disclosed in various sections may be combined with various features found in the same or other sections. The arrangement into sections is merely intended as an organizational aid.

Section 1

Secure Inlay Having A High Frequency (HF) Transponder and an Ultra High Frequency (UHF) Transponder This embodiment of the invention comprises a secure inlay which can be tracked from the start of the production process to the issuance of the card, driver license, national ID, visa or passport to the user. The inlay comprises two passive RFID chips, one contactless chip (first chip) for storing inlay specific data such as information about the second RFID chip (such as serial number, encryption keys, etc.), manufacturers in the value chain, quality tracing data (digital images, process profiles, function tests, charge & batch numbers, production data, etc), privileges and cryptographic keys, and another contactless smart card microprocessor chip (second chip) that will hold pertinent information about the passport holder including a digital facial image and a fingerprint template or iris scan. Even after issuance of the final product, the deployed readers and terminals will also check the data residing on the first chip for authentication purposes. (It should be understood that the second chip does not have to be a microprocessor, but it should have a memory capacity greater than 1 MB).

Generally, as used herein, "chip" is intended to mean RFID or transponder chip. Also, where applicable, "chip" may refer to a die, chip module or carrier or "strap".

Generally, as used herein, "secure" implies that the inlay employs a "contactless" technology, such as set forth in ISO 14443, which is well adapted to conducting personalized transactions such as financial transactions, or identification, and necessarily operates over a short range. (As contrasted with "wireless", which is more wide-range and much less secure).

FIG. 1 illustrates an exemplary configuration of a "secure" inlay 100 comprising a substrate 102, two transponder chips 110 and 120, and a single antenna 116 mounted to (embedded in or adhered to) the surface of the substrate 102. (Generally, prior art "non-secure" inlays only have one chip, corresponding to either one of the chips 110 or 120.) The substrate 102 may be a single or multi-layer substrate, and its top surface is typically a plastic material. Both of the chips 110 and 120 may be RFID transponders.

The substrate 116, and inlay substrates mentioned below (all of which are generally designate "x16") can be a multi-layered substrate in which the chip(s) resides at a different level or layer as the antenna, such as when the chip is in a cavity and supported by another layer underneath the top layer. Or, the antenna and the chip can be on a "common substrate", meaning that the antenna and chip both reside on the surface of the substrate.

The antenna 116 comprises a wire in the form of a flat coil, having two end portions 116a and 116b. The wire may be insulated (such as with an enamel coating), or non-insulated. The antenna 116 is connected by its end portions 116a, 116b to respective terminals 112, 114 of the chip 110. Various different physical configurations for the "main" antenna coil 116 are possible.

End portions 116a and 116b of the antenna wire are shown as being "looped", which is discussed in detail hereinbelow, but looping the ends is not critical to the feature being discussed here, which is a dual chip secure inlay. For purposes of the dual chip secure inlay, the ends of the antenna 116 may be connected to the terminals 112, 114 of the chip 110 in any conventional manner.

Methods and tools for embedding an antenna wire in a substrate are well known, and are shown (for example) in U.S. Pat. No. 6,698,089 ("089").

Techniques for connecting the ends of the antenna 116 to the terminals of the chip 110 are discussed in greater detail hereinbelow. The antenna wire may be an insulated wire, as discussed in greater detail hereinbelow.

The chip 120 is inductively coupled with its own ("on-chip") smaller coil antenna 126 to the "main" antenna coil 116. The chip 120 has two terminals 122, 124. The antenna 126 has two ends 126a, 126b connected to the two terminals 122, 124, respectively. The antenna 126 may be a discrete component added onto the chip 120. The antenna 126 for the chip 120 can be wound, embedded, printed or etched.

The first chip (110) can be compliant to a standard (e.g. ISO 14443) different to that of the second chip (120), which is ISO 15693 compliant. Alternatively, the second chip (110) can be ISO 14443 compliant for short range transmission (proximity), but have the ISO 15693 protocol in its flash memory for vicinity reading in the manufacturing process. The high frequency antenna (126) can be on the silicon device "coil-on-chip", etched on the substrate of the chip module or connected externally to the chip. The second chip (120) could also operate at ultra high frequency.

The second chip (120) can also share the antenna (116) with the first chip, after the embedding of the antenna and interconnection of the wire ends to the contactless smart card microprocessor chip module (first chip). It is not necessary to have a large antenna like (116) connected to the second chip (120) as this chip (120) with a small antenna (126) may be inductively coupled to the main antenna (116).

A suitable material for the inlay substrate is TESLIN, TYVEK, PC, PVC, PE, PET, PETE, Paper, C-FLEX, Paper or Cotton/Noil etc. in sheet format or endless roll (web) can be coated with adhesive film to protect the first chip and to support the process for manufacturing the inlay at the secure printing office. The substrate can also have special markings such as luminous threads, water marks, microscopic filings and optical polymer memory for additional security. A typical thickness for the substrate for passport inlays can be between 360 and 750 microns.

| | |
|---|---|
| PVC | short for polyvinyl chloride, (IUPAC Polychloroethene). PVC is a widely used thermoplastic polymer. It can be made softer and more flexible by the addition of plasticizers, the most widely used being phthalates. |
| PET | short for Polyethylene terephthalate (aka PET, PETE or the obsolete PETP or PET-P). PET is a thermoplastic polymer resin of the polyester family that produced by the chemical industry and is used in synthetic fibers; beverage, food and other liquid containers; thermoforming applications; and engineering resins often in combination with glass fiber. It is one of the most important raw materials used in man-made fibers. |
| PETE | see PET. |
| Teslin ™ | Teslin is a synthetic printing media, manufactured by PPG Industries. Teslin is a waterproof synthetic material that works well with an InkJet printer, Laser printer, or Thermal printer. Teslin is also single-layer, uncoated film, and extremely strong. In fact, the strength of the lamination peel of a Teslin sheet is 2-4 times stronger than other coated synthetic and coated papers. Teslin comes in the sizes of 7 mil to 18 mil, though only sizes 10 mil and 14 mil are sized at 8.5" by 11", for printing with most consumer printers. Also available are perforated versions of Teslin, specifically, 2up, 6up, and 8up. |
| Tyvek ™ | Tyvek is a brand of spunbonded olefin, a synthetic material made of high-density polyethylene fibers; the name is a registered trademark of the DuPont Company. The material is very strong; it is difficult to tear but can easily be cut with scissors or any other sharp object. Water vapor can pass through Tyvek, but not liquid water, so the material lends itself to a variety of applications: medical packaging, envelopes, car covers, air and water intrusion barriers (housewrap) under house siding, labels, wristbands, mycology, and graphics. |

The substrate can be a multi-layer substrate.

The substrate (for example, a layer thereof) may be doped with microscopic metal filings (such as 10 mm long and 10 µm in diameter) for enhanced security (described in greater detail hereinbelow, with respect to FIG. 8A).

The substrate material does not need to be coated with an adhesive or thermoplastic substance however the coating can be used to facilitate the wire mounting (embedding, placing) process.

The substrate (for example, a layer thereof) may also incorporate a woven mesh, such as coated fleece (a cotton material) to provide enhanced tensile strength.

The substrate may be prepared in a given format (such as in a sheet format with 3×6=18 transponder sites per sheet) to suit the production process of the secure card manufacturer or printing office, and every transponder site in the format may have the second contactless chip 120 embedded into the material at a predefined position.

The second contactless chip 120 may be provided with a unique identification code or secret key which is masked by the silicon provider, programmed by the substrate manufacturer or downloaded in encrypted form from a central database.

The second contactless chip 120 with digital signature can be used to verify that the e-passport was issued by a legitimate authority, and that it had not been altered.

For privacy protection, a thin radio shield (anti-skimming material, such as a metal mesh) can be sandwiched as an additional layer between two existing layers of the inlay (substrate), resulting in a capacitive gap between the transponder and the layer with the anti-skimming material. This means that the digital information in the chip(s) can only be read from one direction. This is described in greater detail hereinbelow, with respect to FIG. 8B).

In an embodiment of the invention for electronic passports and national ID documents, the two chips operating at different ISO standards can be used to prevent unauthorized reading of the data in the first chip by causing collision of the communications, making the information illegible. Only when the passport is read at close proximity by a certified OCR reader with a specific antenna, is it possible to access the data.

The technology provides total accountability of the process from "cradle to grave" and performs the function of a blind audit. In the production "zero balance" can be easily achieved as every inlay site has the second contactless chip with a unique ID code and storing data on the functional or non-functional smart card microprocessor.

In another embodiment of the invention for ID cards, the two RFID chips have interrelated cryptographic algorithms and session keys (secret keys & card management infrastructure) which enhance security in interoperable federal identity management systems. Also, the first RFID chip can store dynamic privileges such as user's permissions, restricted access and expiry data and the second RFID chip stores the personal credentials.

The Federal Information Processing Standard (FIPS) 201 is the mandatory identity management systems (IDMS) for access to federal facilities and systems for all federal departments and agencies. It applies to all employees and contractors of federal departments and agencies, requiring physical access to federal facilities and logical access to federal systems. The Personal Identity Verification (PIV) card holding a person's credentials must meet the stringent requirements of the FIPS 201 standard and to this end, the dual chip configuration (such as shown in FIG. 1) provides the solution for managing the "chain of trust" process.

In addition, the invention provides a mechanism to tract status, control inventory, and protect blank PIV card stock and personalized card stock prior to activation. In short, the system is capable of creating an auditable trail.

Personalization machines, terminals and printers would be equipped with dual standard RFID readers with anti-collision capability, to ensure secure and reliable identification from pre-issuance to issuance, post-issuance and to re-issuance or deactivation of the PIV card.

The substrate or inlay can also be doped with microscopic metal filings for enhanced security (personalization). Anti-skimming measures are also described to prevent unauthorized scanning of the data in the memory of both of the RFID chips (110, 120). See FIG. 8

A secure, dual-chip inlay is described hereinabove, comprising one passive RFID chip (110) storing information about the user or bearer, while the other passive RFID chip (120) stores information pertaining to the manufacturing process, steps in the value chain from inlay to final product, personalization and activation.

The applications for such technology include electronic passports, I-94 waiver visas, national identity cards, citizen cards, permanent residence cards, personal identity verification cards, registered traveller cards, driving licenses, etc.

The chips can operate at 13.56 MHz (High Frequency, "HF") and can be compliant with ISO 14443 and/or ISO 15693. Equally, one chip can operate at high frequency ("MHz") and the other at ultra-high frequency ("UHF").

Section 2

Techniques for Connecting Ends of Antenna Wire to Terminals of Transponder Chips or Chips Modules on an Inlay Substrate Forming Loops Typically, in the prior art, the ends of an antenna (such as 116) mounted to the surface of an inlay are passed directly over the terminals (such as 112, 114) of the transponder chip (such as 110), and are thermal compression bonded thereto. Usually, this involves two separate tools. After embedding (using a "sonotrode") the wire into the substrate over a short distance, the wire is passed over a first terminal area, then embedded (such as in a flat coil pattern) to form an antenna, and then is passed over a second terminal area, and then is embedded into the substrate before cutting the wire. In a separate station, the wire ends of the antenna residing over the terminal areas of the chip are interconnected using thermal compression bonding (using a "thermode"). The wire is typically "insulated" (not bare at the terminal areas).

According to an embodiment of the invention, ends (such as 116a, 116b) of an antenna wire (such as 116) may first be formed as free-standing (in that they are not mounted to the substrate) "loops" adjacent terminals (such as 112, 114) of a transponder chip (such as 110). This is in preparation for bonding the loops (or a tip portion of the loops) to terminals of the transponder chip. The transponder chip may or may not already be in place on the substrate. (If the transponder chip is not already in place during loop formation, the loops are formed adjacent designated "terminal areas" whereat the terminals of the transponder chip eventually will be).

If the wire is an insulated wire, the insulation can be removed either during the embedding process, or after the loops are formed.

Looping (as it is referred to herein) may be done using the same tool (hereinafter referred to as "embedding tool") that is used to mount (embed or place) the antenna wire and form the coil pattern for the antenna.

Generally, after mounting the antenna and forming the loops, a manipulating tool may be used to reposition (which may involve gripping, grabbing and/or pushing) the loops to a position which is over (above) the terminals of the transponder chip (with the transponder chip in place), then a bonding tool may used to bond/connect the repositioned loops to terminals of a transponder chip, using conventional bonding techniques.

It is worthwhile noting (for background purposes) that a traditional "wire bonding loop" typically involves a bond wire being thermocompression bonded to a first bond area such as a bond pad of a device (such as an IC chip being mounted in a leadframe), then the bonding tool rises and moves over to a second bond area (such as an inner portion of a leadframe finger), bonds the wire to the second bond area, and cuts the bond wire, leaving a freestanding arch (or bridge) of wire extending between the two bond areas to which it is bonded.

As discussed in greater detail hereinbelow, the loops may be formed adjacent terminal areas for a transponder chip, either before or after the transponder chip is mounted to the substrate. And, the loops may be what is called "jump loops", when they rise above the surface of the substrate in a manner similar to wire bonding loops (such as in a plane perpendicular to the surface of the substrate), or they may be what is called "planar loops" when they lie substantially in the plane of the surface of the substrate spanning across slots which have been provided in the substrate adjacent the terminal areas of the transponder chip. After forming the antenna and the loops, and after the transponder chip is in place (which may occur either before or after the loops are formed), a separate tool is used to reposition the loops, and a separate tool is used to bond the repositioned loops to terminals of a transponder chip.

As used herein, forming a "loop", or "looping" generally means that as an embedding tool is moving across (including on and/or above) the surface of the substrate and playing out wire, wire that is being embedded and forming a pattern in the substrate reaches a point where the embedding is stopped. That is generally what would happen at the end of a coil pattern. At the beginning of antenna formation, the wire can be embedded for only a very short distance, then stop being embedded.

After stopping embedding, the embedding tool continues to move across the surface of the substrate and the wire continues to play out of the embedding tool, forming a free-standing (not embedded) loop.

After the shape of the loop is formed, the embedding tool continues to move across the surface of the substrate and the wire continues to play out (typically referred to as "wire feed") of the embedding tool, the wire is again embedded, and if this is the end of a coil pattern, the wire is cut. If at the beginning of antenna coil formation, the embedded tool continues to move across the surface of the substrate, changing direction as may be required to form the pattern of the antenna coil, until reaching the end of the pattern, then stops embedding, forms a second loop, embeds a short distance to secure what will be a free end of the wire, then cuts the wire, resulting in an antenna coil embedded in a substrate and having two end portions formed as loops in preparation for connecting to terminals of a device (transponder) on the substrate.

Since the "embedding" tool is used to "mount" the antenna wire on the substrate, including either embedding the wire into the surface of the substrate, as well as adhesively placing the wire on the surface of the substrate, it may be referred to hereinafter as a "mounting" tool.

Generally, when the embedding (mounting) tool is used to adhesively place the wire on the surface of the substrate, the wire is a coated wire. Although a coated wire can be bonded to a terminal of a transponder chip, it is preferable that the bond coat and insulation should be removed prior to bonding the loops of the antenna to the terminals of the transponder chip. Else, particular matter may remain after bonding. As discussed in greater detail hereinbelow, coatings can be removed from the wire, particularly at the loops either while mounting (embedding or positioning) the wire on the substrate, or after completion of mounting and loop formation.

The "origins" of the looping method described herein may be traced to U.S. Provisional Application 60/826,923 filed Sep. 26, 2006 by Finn which describes how the wire ends of an antenna may be formed in preparation for interconnection with the terminal areas of an RFID chip.

In FIG. 1 of the S4 provisional, the wire is first embedded into a non-conducting substrate using an ultrasonic embedding horn near the terminal area (of the RFID chip) to create a tail position and it is noted that it is not necessary to pass the wire over the terminal area as illustrated, but rather the insulated wire can be embedded into the substrate close to the RFID chip and then a section of the wire may be bonded to the terminal area, in short, tailing bonding to the substrate and then wedge bonding to the terminal area.

In FIG. 2 of the S4 provisional, the insulation is removed in preparation for wedge bonding and the removal of the wire insulation before connection (e.g. per laser) is performed in order to bond the wire ends (e.g. doped copper) directly to the aluminum pads of an RFID chip or to enlarged pads on a silicon chip.

In FIG. 3 of the S4 provisional, a section of un-insulated wire is wedge bonded to one of the contact terminals of the RFID chip. In the next step as illustrated in FIG. 4, the wire is embedded into the non conducting substrate (alternatively but not shown, the insulated wire is looped around the bond position so as to return the wire to the substrate, where the wire is then embedded into the non conducting substrate (tail position).

FIG. 14 of the S4 provisional graphically illustrates an alternative method of preparing the wire ends of the antenna for interconnection by looping the wire around the bond position of an RFID chip. For the purpose of clarity, the bond position of an RFID chip or module is also the terminal area of the device. In this figure, the chip module resides in a cavity and is supported by a second or third layer of substrate. In FIG. 14(B), the wire is looped around the first terminal area prior to interconnection and as highlighted above the wire does not have to pass over the terminal area, but positioned near the terminal area. As clearly shown in FIG. 14(B), the looped wire is left to dangle near the first terminal area and in the next step the wire is placed or embedded onto or into the substrate to form the antenna. FIG. 14(C), reinforces the concept of looping around the bond position, by creating a loop near the terminal area.

U.S. Provisional Application 60/883,064 filed Jan. 1, 2007 by Finn describes a technique for producing an RFID inlay with an array of transponder sites, especially used in the manufacturing of contactless smart cards and electronic passports, by embedding or placing a section of a wire conductor into or onto a substrate near the first terminal area of an RFID chip, raising the wire conductor off the substrate to form a free standing loop along side the first terminal area, then returning to the level of the substrate and continuing the wire embedding or placement process to form an antenna with a given number of turns in or on the substrate. After forming the antenna, the wire conductor may be positioned along side the second terminal area in the same manner as described above, resulting in a loop on each side of the respective terminal areas. Then, the wire conductor is placed or embedded onto or into the substrate over a short distance before cutting the wire. In the next stage of the process, the loops may be mechanically drawn in over the terminal areas in preparation for interconnection to the terminals.

FIGS. 2A and 2B herein correspond to FIGS. 1A and 1B of the S5 provisional, and illustrate a technique for forming free-standing loops, referred to herein as "jump loops".

FIG. 2A illustrates an inlay 200 (compare 100) comprising a substrate 202 (compare 102) which may be a multi-layer substrate. An antenna wire 216 (such as an HF antenna, compare 116) is mounted to (embedded in or adhesively placed on) the substrate 202. The antenna is shown as a coil antenna having two ends, but it could as well be two separate wires (a dipole antenna using wire squiggles to enhance performance).

The substrate 202 may be one of several locations on a larger substrate whereupon a plurality of inlays are being manufactured, and in this regard, the reference numeral "202" may be considered to be a "transponder (or inlay) site".

Attention is directed to end portions 216a and 216b (compare 116a, 116b) of the antenna wire 216. The end portions 216a and 216b will ultimately be connected to corresponding terminals 212 and 214 of a transponder chip 210.

More generally, if the transponder chip 210 is not already in place when the antenna wire is mounted to the substrate, and the two loops are formed, the reference numeral 210 would refer to a site for a transponder chip (or chip module), the reference numeral 212 would refer to a first "terminal area", and the reference numeral 214 would refer to a second "terminal area". Alternatively, a recess or cavity 226 (described in the next paragraph) can be considered to be the "site" for the not-yet-in-position transponder chip.

A recess or cavity 226 may be formed in the surface of the substrate to help align (locate), as well as to recess (lower the position of), the transponder chip 210. In a multi-layer substrate, the recess or cavity 226 may extend into the substrate from a surface of the substrate, through at least a top layer of the substrate, extending to a lower layer of the substrate. When the transponder chip 210 is disposed in (received by) the cavity 226, it will be supported by the lower layer(s) of the substrate. A multi-layer substrate is illustrated in FIG. 8.

The end portions 216a and 216b of the antenna wire 216 (or wires, plural, in the case of a dipole antenna) are not mounted to (embedded in or adhesively placed on) the substrate 202. Rather, in the process mounting, described in greater detail hereinbelow, the end portions 216a and 216b of the antenna wire 216 are left un-mounted, and are thus "free-standing". In this embodiment, the end portions 216a and 216b of the antenna wire 126 are each formed as generally upside-down U-shaped loops, similar in appearance to a conventional wire-bonding loop. Each of these loops formed by the end portions 216a and 216b of the antenna wire 126 may be in a plane which may be substantially perpendicular to the surface of the substrate. Generally, if the plane of the loops is inclined, it should be inclined away from the transponder site so as not to interfere with subsequent installation of a transponder chip at the transponder site.

In the next embodiment, described hereinbelow with respect to FIGS. 2C and 2D, loops which are in planes which are substantially parallel to or coincident with the surface of the substrate. It should be understood that an important feature of loops formed by the end portions 216a and 216b of the antenna wire 126 is that they are not mounted to (embedded in or adhesively positioned on) the substrate, but rather are "free-standing", and can be manipulated (their position and/or orientation changed), to some extent (thin wire has some malleability and elasticity).

An important feature of the loops is that they are located adjacent (next to, along side of) first and second terminal areas (or terminals 212 and 214, if the transponder chip 210 is in place) for the transponder chip 210, in preparation for connecting the loops to the terminals of the transponder chip (once it is in place). As mentioned above, they can be manipulated, so that in a next step (illustrated in FIG. 2B) they will be positioned above terminals of the transponder chip (once the transponder chip 210 is in its place (216) on the substrate 202).

FIG. 2B illustrates that the loops are subsequently (such as after the transponder chip is in place) manipulated (drawn in, deflected, moved, bent, repositioned, extended) to be substantially directly over the terminals 212, 214 of the transponder chip 210, in preparation for interconnection (such as bonding) to the terminals 212, 214 of the transponder chip 210.

The transponder chip 210 may or may not have been in place prior to mounting the antenna and forming the loops. In FIGS. 2A and 2B, the transponder chip 210 is shown already in place, located in a cavity or recess 226 (dashed lines surrounding the transponder chip 210) formed in the surface of the inlay substrate 202 to accommodate (receive, locate, recess) the transponder chip 210. The transponder chip 210 is shown positioned in the cavity 226.

When the transponder chip 210 is in place (installed on the substrate, at the transponder site), the loops are drawn in (re-positioned, manipulated to be) over the terminals, and then the loops are connected (bonded) to the terminals of the transponder chip. If the wire is an insulated wire, there may (or may not) be an insulation removal step before connecting (bonding) the loops to the terminals.

It should be understood that it is not necessary to bond an entire loop to a terminal, rather only a portion thereof, such as a tip (apex) portion.

It should also be understood that if the antenna wire is an insulated wire, having one or more coatings to assist (for example) in mounting by adhesively placing the antenna wire on the substrate, the coating(s) (self bonding coat and insulation layer) should be removed prior to bonding. Removal of the coating(s) (insulation) from an insulated wire (from the loops, or from tips of the loops—importantly from a portion of the wire that will be bonded to the terminal(s) of the transponder chip) are discussed in greater detail hereinbelow (and may involve using apparatus such as a laser or a hot iron to remove the coating(s)), and can be done (performed) either during mounting the antenna wire, or after having mounted the antenna wire over slots and formed the loops in preparation for bonding.

FIGS. 2C and 2D herein correspond to FIGS. 4A and 4B of the S5 provisional, and illustrate and illustrate an alternative technique for forming free-standing loops, referred to herein as "planar loops". (Generally, similar elements are renumbered with +50 increment).

Although the loops of this method do not resemble wire bonding loops, they are nevertheless "free-standing" in the sense that while the rest of the antenna wire is mounted to (embedded in or adhesively placed on) the substrate, the end portions of the wire are not mounted, but rather (as in the previous example) are located adjacent terminal areas for the transponder chip in preparation for being bonded to the terminals of the transponder chip, then with the transponder chip in place are manipulated (repositioned) to be substantially directly above the terminals of the transponder chip, then are bonded to the terminals of the transponder chip. However, as will be seen, in this embodiment, the loop ends of the antenna wire are substantially either in the plane of the surface of the substrate, or in a plane substantially parallel to the surface of the substrate.

FIG. 2A illustrates an inlay 250 (compare 200) comprising a substrate 252 (compare 502) which may be a multi-layer substrate. An antenna wire 266 (compare 216) is mounted to the substrate 252. As in the previously-described embodiment, the antenna is shown as a coil antenna having two ends, but it could as well be two separate wires (a dipole antenna with or without squiggles or zigzag patterns). As in the previously-described embodiment, the substrate 252 may be one of several locations on a larger substrate whereupon a plurality of inlays are being manufactured, and in this regard, the reference numeral "252" may be considered to be a "transponder (or inlay) site".

Attention is directed to end portions 266a and 266b (compare 216a, 216b) of the antenna wire 266. The end portions 266a and 266b will ultimately be connected to corresponding terminals 262 and 264 (compare 212, 214) of a transponder chip 260 (compare 210).

As in the previously-described embodiment, if the transponder chip 260 is not already in place when the antenna wire is mounted to the substrate, and the two loops are formed, the reference numeral 260 would refer to a site for a transponder chip (or chip module), the reference numeral 262 would refer to a first "terminal area", and the reference numeral 264 would refer to a second "terminal area". Alternatively, a recess or cavity 276 (described in the next paragraph) can be considered to be the "site" for the not-yet-in-position transponder chip.

A recess or cavity 276 (compare 226) may be formed in the surface of the substrate to help align (locate), as well as to recess, the transponder chip 260. As in the previously-described embodiment, in a multi-layer substrate, the recess or cavity 276 may extend into the substrate from a surface of the substrate, through at least a top layer of the substrate, extending to a lower layer of the substrate. When the transponder chip 260 is disposed in (received by) the cavity 276, it will be supported by the lower layer(s) of the substrate.

The end portions 266a and 266b of the antenna wire 266 (or wires, plural, in the case of a dipole antenna) are not mounted to (embedded in or adhesively placed on) the substrate 252. Rather, in the process mounting, described in greater detail hereinbelow, the end portions 266a and 266b of the antenna wire 266 are left un-mounted, and are thus "free-standing".

In the previous embodiment, the end portions 216a and 216b of the antenna wire 126 are each formed as generally upside-down U-shaped loops, similar in appearance to a conventional wire-bonding loop, and each of the loops formed by the end portions 216a and 216b of the antenna wire 126 may be in a plane which may be substantially perpendicular to the surface of the substrate.

In this embodiment, slots or openings 282 and 284 are formed adjacent the recess 276, generally on opposite sides of the recess 276, and generally adjacent the terminal areas 262, 275. These slots or openings 282 and 284 extend completely through the substrate 252.

Loops formed in this embodiment are defined as portions of the end portions 266a and 266b of the antenna wire 266 which span (extend over) the slots or openings 282 and 284, substantially in the plane of the surface of the substrate. It should be understood that this includes extending in a straight line over the respective slot, as well as curving away from the recess 276, then back towards the recess 276 as the end portion of the wire transits the slot. In other words, generally, as the antenna wire is being mounted to the substrate, the mounting process stops just before encountering the slot (where the wire cannot be mounted, anyway), and resumes after passing the slot. In the interim, while traversing the slot, the wire can be caused to take a non-straight (curved) path, such as initially away from the recess 276 then back towards it. A slightly curved loop path may provide some needed slack in the wire for subsequent manipulation of the loop thus formed to a position above a terminal of a transponder chip, for bonding thereto. However, the wire typically used in these applications tends to have sufficient malleability and elasticity that even a straight "loop" could be repositioned over the terminal of the transponder chip for bonding thereto.

As in the previously-described embodiment, an important feature of the loops is that they are located adjacent (next to, along side of) first and second terminal areas (or terminals 262 and 264, if the transponder chip 260 is in place) for the transponder chip 260, in preparation for connecting the loops to the terminals of the transponder chip (once it is in place). As mentioned above, they can be manipulated, so that in a next step (illustrated in FIG. 2B) they will be positioned above terminals of the transponder chip (once the transponder chip 260 is in its place (266) on the substrate 252).

FIG. 2D illustrates that the loops are subsequently (such as after the transponder chip is in place) manipulated (drawn in, deflected, moved, bent, re-positioned, manipulated, extended, bent) to be substantially directly over the terminals 262, 264 of the transponder chip 260, in preparation for interconnection (such as bonding) to the terminals 262, 264 of the transponder chip 260.

The transponder chip 260 may or may not have been in place prior to mounting the antenna and forming the loops. In FIGS. 2C and 2D, the transponder chip 260 is shown already in place, located in a cavity or recess 276 (dashed lines surrounding the transponder chip 260) formed in the surface of the inlay substrate 252 to accommodate (receive, locate, recess) the transponder chip 260. The transponder chip 260 is shown positioned in the cavity 276.

When the transponder chip 260 is in place (installed on the substrate, at the transponder site), the loops are drawn in over the terminals, and then the loops are connected (bonded) to the terminals of the transponder chip.

It should be understood that it is not necessary to bond an entire loop to a terminal, rather only a portion thereof. In the previous embodiment (jump loops), this could be a tip (apex) portion. In this embodiment (planar loops), if the loop traverses straight across the slot, it could be a mid-portion of the re-positioned loop—for example in FIG. 2D the repositioned (manipulated) loop does have an arcuate shape that has an apex to it.

As in the previously-described embodiment, it should also be understood that if the antenna wire is an insulated wire, having one or more coatings to assist (for example) in mounting by adhesively placing the antenna wire on the substrate, the coating(s) should be removed prior to bonding. Removal of the coating(s) from an insulated wire (from the loops, or from tips of the loops—importantly from a portion of the wire that will be bonded to the terminal(s) of the transponder chip) are discussed in greater detail hereinbelow (and may involve using a laser to remove the coating(s)), and can be done (performed) either during mounting the antenna wire, or after having mounted the antenna wire and formed the loops in preparation for bonding.

In a final step, the wire ends of the antenna residing over the terminals of the transponder chip are connected (bonded) to the terminals of the chip. The interconnection process can for example be inner lead bonding (diamond tool), thermal compression bonding (thermode), ultrasonic bonding or laser welding. Prior to interconnection the insulation layer of the wire conductor may (or may not) be removed.

There have thus been described two embodiments of loops in end portions of an antenna wire (or two antenna wires, in the case of a dipole antenna). In both embodiments, the loop comprises an un-mounted (free standing) end portion of the antenna wire, substantially the entire remainder of the antenna wire being mounted to (embedded in or adhesively positioned on) the substrate.

The jump loops described with respect to FIGS. 2A and 2B are arcuate, and pre-positioned in a plane that is substantially perpendicular to the surface of the substrate. The planar loops described with respect to FIGS. 2C and 2D may be substantially linear, or may be arcuate, and are pre-positioned in a plane that is substantially coplanar with the surface of the substrate.

Generally, the longitudinal extent of either one of the jump loops or planar loops may be approximately 3-4 mm for a chip module. This is the portion of the wire, near the end of the wire, that is not mounted to the substrate. It should be understood, and is described in greater detail hereinbelow, with respect to FIG. 4A, that in both embodiments, the extreme end (such as the last 8 mm of the antenna wire is also embedded.

As discussed above, after the transponder chip is installed, the loops may be repositioned so as to be over the terminals of the transponder chip, for connecting thereto. It should be understood that the loops need not actually contact the terminals when re-positioned. It is, however, important that the loops be above (such as directly above) the respective terminals to which they will be bonded. When the bonding tool is brought to bear upon the re-positioned loop to connect it to the terminal, downward motion (analogous to 334) of the bonding tool will urge the loops into contact with the terminals, during the bonding procedure.

In this embodiment, the purpose of the slots 282, 284 on each side of the window/recess 276 is to allow a mechanical tool (discussed hereinbelow, FIG. 9B) to pass through the substrate 252 with the objective of aligning the wire conductor in the direction of the terminal area of the RFID (transponder) chip which will be (or already is) located in the window/recess 276. The slots permit a tool to grab (or push) the planar loop of the end portion of the antenna onto the terminal for connection (bonding) thereto.

In producing a transponder inlay, the substrate is prepared with a window and slots on each side of the window at each transponder site. The window can have underlying layers of substrate to support the chip, whereas the slots can extend through all of substrate layers of the inlay to allow the mechanical tool to manipulate the wire conductor (ends of the antenna) on the top substrate layer.

In commencing a transponder site, the following sequence of steps may occur:
(a) an RFID chip is positioned in the cavity (window);
(b) the wire conductor is routed over the first slot along side the first terminal area;
(c) the antenna is formed with several turns of wire;
(d) the wire conductor is passed over the second slot along side the second terminal area;
(e) then the two wire ends of the antenna passing over the two slots are manipulated to be drawn in over the terminal areas and thus creating loops dangling over the terminals of the chip;
(f) the loops are further manipulated to be ready for interconnection; and
(g) the loops are interconnected to the chip using conventional bonding techniques.

Generally, the methods described hereinabove (with respect to FIGS. 2A/2B and 2C/2D) separate the embedding (or placement) of the antenna wire and the interconnection to the transponder chip processes in the manufacture of the transponder inlay. In a first step, the embedding or placement of the antenna at each transponder site on the inlay may be performed by a wire routing station. In a second step the placement of the RFID chip in the window or cavity at each transponder site may be performed by a pick & place station. And, in a final step the interconnection of the wire ends of the antenna to the terminal areas of the chip is undertaken in a separate bonding station. See, for example, FIG. 10.

In the prior art (see, e.g., U.S. Pat. No. 6,698,089) all of these steps would generally be done at one station. By separating the steps, efficiencies can be increased—for example, the embedding process may take 10 to 12 seconds per head, while the bonding process is only a few seconds. By separating the manufacturing processes, into different stations, the up-time of the machines and the yield can be increased.

Using the methods disclosed herein, a transponder site may be started by using the ultrasonic wire guide tool to embed or place a section of the wire conductor into or onto the substrate along side the edge of the window or recess (or cavity) where the chip will reside, the ultrasonic wire guide tool embeds or places the wire conductor into or onto the substrate creating an antenna with a given number of turns, then embeds or places the wire conductor into or onto the substrate along side the edge of the window on the opposite side. Therefore, the wire conductor is routed along side both edges of the window. (And, the ends may for free-standing loops or planar loops spanning slots next to terminal areas). In the next stage of the process in a separate station the chip is placed in the window, meaning that the wire ends of the antenna are now routed in or on the substrate along side the terminal areas of the chip.

For the purpose of alignment using a vision system, it is possible to have index holes or slots in the substrate on each side of the cavity to support the mechanical positioning of the wire conductor to the terminal areas. Finally, the wire ends of the antenna routed along the two sides of the window where the chip resides are drawn in over the terminal areas for interconnection.

An alternative method which may be applicable for a substrate in which a chip module and the antenna are positioned on a common substrate, whereby the antenna resides on the top side of the substrate and the module on the bottom side. The substrate has a cavity to accommodate the mould mass of the chip module and slots or holes to create an opening in the substrate to the terminal areas of the chip module for interconnection and the wire conductor is placed or embedded onto or into the top surface of the substrate when forming an antenna and the chip module resides below the substrate, whereby the wire ends of the antenna are connected through the slots in the substrate to the terminal areas of the chip module. In forming the antenna, the wire conductor is passed over the slots in preparation for interconnection.

As described above, the inlay may comprise several layers of substrate in which the electronic components are sandwiched between these layers. In the final production step, the layers of substrate are either cold laminated (an adhesive process) or hot laminated.

Section 3

Method and Apparatus for Embedding Antenna Wire in an Inlay Substrate

An Embedding Tool

FIGS. 3A-C illustrate an embodiment of an embedding tool 300, for embedding a wire 316 in a substrate 302, and for forming loops (such as jump loops and planar loops, as described above) in the wire, in preparation for bonding to terminals of a transponder chip in an inlay substrate.

Generally, another tool would reposition the loop over the terminal (e.g., 112/114, 212/214, 262/264) of a device (e.g., 110, 200, 250), and examples are shown hereinbelow (FIGS. 9A and 9B). And, another tool, such as a conventional thermode (not shown) would be needed to connect (such as by thermocompression bonding) the repositioned loop to the terminal of the device.

Generally, the wire 316 may be a bare metal (such as copper or gold) wire, or is may be an insulated wire having one or more coatings. An insulated wire is described hereinbelow, with respect to FIG. 6. An exemplary wire is Electrisola brand enamelled copper wire. 0.010-0.50 mm (AWG 24-58) (0.010 mm=100 micron). A 112 micron wire may have only a few microns of insulation on it.

The wire conductor 316 can be for example self-bonding copper wire or partially coated self bonding copper wire, enamel copper wire or partially coated enamel wire, silver coated copper wire, un-insulated wire, aluminum wire, doped copper wire or litz wire.

The embedding tool 300 comprises:
- a sonotrode/ultrasonic horn 330 having an end 332 for embedding a wire 316;
- a rotary wire guide 340 disposed adjacent the end 332 of the sonotrode 330 for feeding the wire 316 to under the end 332 of the sonotrode 330; and
- a cutting mechanism 350 disposed adjacent the rotary wire guide 340 for severing (cutting) the wire 316.

The sonotrode 330 has a generally cylindrical end portion, terminating in an end 332 which is for embedding the wire. Unlike conventional sonotrodes which have wire feeding down the center of the sonotrode, or through the side of the sonotrode (the wire 316 is not fed through the sonotrode 330 at all. The sonotrode may be similar to the vibrating punch (92) of U.S. Pat. No. 6,698,089 which shows (in FIG. 12) that a separate wire guide (95) feeds the wire to under the end of the vibrating punch. However, in U.S. Pat. No. 6,698,089 the end surface of the vibrating punch has a channel shape, and the sonotrode 330 does not.

Generally, as will become evident from further discussion, a reason that the sonotrode 330 does not (or should not) have a channel shape is to maintain its isotropic ability to perform its function equally, moving in any (x, y) direction on the plane of the substrate without changing its rotational position, and a separate rotary wire guide 340 takes care of changing the trajectory of the wire. However, it is within the scope of the invention that the "business end" 332 of the sonotrode have a profile particularly adapted to embed (or, as discussed elsewhere, to adhesively position) the wire on the substrate.

The sonotrode 330 is capable of moving up and down, as illustrated by the arrow 334, so that when the wire 316 is positioned underneath the end 332 of the sonotrode 330, the wire may be urged against the surface of the substrate 302 for embedding in the surface of the substrate. (Typical up/down movement in the range of 1-2 mm.) Alternatively, when the sonotrode 330 is lifted, the wire 316 will not be urged against the surface of the substrate 302. A mechanism for positioning the sonotrode either down (urging the wire against the surface of the substrate) or up (not urging the wire against the surface of the substrate) is commonplace (well-known), and is omitted from the figure, for illustrative clarity.

When the wire 316 is urged against the surface of the substrate 302 by the end 332 of the sonotrode 330, the sonotrode 330 is generally caused to vibrate, typically at an ultrasonic frequency such as 60 KHz, to cause the wire 316 to embed into the surface of the substrate 302. A mechanism for causing the sonotrode 330 to vibrate is commonplace, and is omitted from the figure, for illustrative clarity.

The embedding of insulated wire or self bonding wire into a synthetic substrate may performed using an ultrasonic horn and converter operating at a frequency between 35 and 60 kHz, and exerting a force of approximately 5 N (Newton) to sink the wire into the substrate. To embed onto a paper substrate, more pressure (approximately 15 to 20 N) is required to form an adhesive attachment between the self-bonding insulated wire and the paper substrate.

If self-bonding wire is used, it is possible to place the wire (adhesive process) on the substrate rather than embed it. This can be accomplished with the sonotrode 330 functioning as an ultrasonic horn (as in embedding), since the vibrations will generate heat. Alternatively or additionally, a heating element may (or may not) be provided in the sonotrode 330 for performing or assisting in adhesively placing (bonding) a self-bonding wire to the substrate, but is generally not necessary.

The entire ultrasonic embedding tool 300 is capable of being rotationally positioned ("turned", in contrast to "rotating"), about an axis (CL), as illustrated by the arrow 336. This turning capability of the sonotrode is important when routing the wire conductor around the rectangular corners of an antenna coil shape (such as shown in FIGS. 2A, 2B, 2C, 2D). A mechanism for turning the tool 300 is commonplace, and is omitted from the figure, for illustrative clarity.

The sonotrode 330 (the entire tool 300) is also capable of being moved along (parallel to) the surface of the substrate 302, as indicated by the arrows "x" and "y". This movement of the sonotrode is important for forming the antenna pattern (such as the coil pattern of antenna 116). (Note that the up/down arrow 334 would represent the "z" axis in the "xyz" orthogonal coordinate system).

The rotary wire guide 340 is generally cylindrical, fitting like a sleeve (or a tube) on the end portion of the sonotrode 330 and is free to be rotationally positioned (turned) independent of the sonotrode 330, as indicated by the arrow 346 (compare 336). Generally, no independent up/down motion of the wire guide 340 is needed, it can move up and down with the sonotrode 330 (arrow 334). (The wire guide is analogous to the outer race of a ball bearing, with the sonotrode being the inner race. The outer race can turn independent of the inner race, but will always be in the same plane as the inner race). A mechanism for turning the wire guide is commonplace, and is omitted from the figure, for illustrative clarity.

The purpose of the wire guide 340 is to guide wire 316 from an external supply (discussed below) to under the end 332 of the sonotrode 330, so that the wire 316 can be (if desired, with the sonotrode in the "down" position) embedded in to the surface of the substrate 302. In order to effect this purpose, the end 342 of the wire guide 340 is provided with a small feed hole (or "eye", as in eye of a needle) 344 through which the wire 316 can be inserted (or "threaded", akin to threading a sewing machine needle). This is best viewed in FIG. 3B where the wire 316 can be seen passing through the wall of the wire guide 340, at approximately a 45-degree (30-60 degree) angle.

To put things in perspective, and by way of example only:
- the diameter of the bottom end portion of the sonotrode 330 may be approximately 8 mm;
- the spacing between the sonotrode 330 and the wire guide 340 may be approximately 100 microns;
- the wire guide 340 may have a wall thickness of 4 mm.
- the wire 316 may have a diameter of approximately 112 microns; and
- the hole 344 through the wall of the wire guide 340 may be approximately 300 microns.

When the sonotrode 330 rises up (arrow 334), it moves approximately 1-2 mm.

When different wire sizes are used (wires having a diameter which is either smaller or larger than 112 microns may be used), the wire guide, or a separate sleeve (not shown) defining the hole through which the wire passes, may need to be changed to accommodate the different wire size.

The wire 316 is fed/directed (provided, guided) to the wire guide 340 by a nozzle 360. The nozzle 360 is generally cylindrical, having an axial bore sufficient to accommodate the wire 316 passing axially therethrough. The nozzle 360 is positioned by any suitable mechanism/linkage, indicated by the dashed line 364 so that its end 362 (left, as viewed) is adjacent/near (such as 5 mm away from) the hole 344 in the wire guide 340, and so that it moves with the wire guide 340 on a 1:1 basis (up/down, rotating).

In order to feed the wire conductor back and forth through the ultrasonic wire guide tool, a wire tension/push mechanism can be used or by application of compressed air it is possible to regulate the forward and backward movement of the wire conductor by switching the air flow on and off which produces a condition similar to the venturi effect.

The nozzle 360 is provided with at least one inlet 366. Compressed air (gas) may be provided through the inlet.

A similar nozzle, or another inlet to the same nozzle, may be used to introduce laser light via a glass fiber while embedding (or placing) the wire, as discussed below with respect to FIG. 7A.

A conventional clamping mechanism 370 is provided, typically upstream of the nozzle 360, for securing/holding the wire 316, and would move on a 1:1 basis with the nozzle 360. Generally, when the clamping mechanism 370 is not clamping the wire 316, the wire is free to play out from a supply spool (not shown), such as when an end of the wire 316 is embedded in the surface of the substrate, and the sonotrode 330 is moving (such as to create an antenna pattern), or when the wire guide 340 is moving (such as to create a loop shape), or both.

The primary reason for clamping the wire is during cutting and preventing the wire from moving especially when the head is moving at high speed from one transponder site to the next.

Clamping the wire may also be needed to put tension on the wire when going around corners (such as when making a rectangular coil antenna).

The above describes all the mechanism which is needed to embed the wire 316 in the surface of the substrate 302, and form a loop adjacent a terminal of a device. All that's left is to cut off the wire 316, and start another operation, on the same or another inlay.

A cutter 350 is provided, generally concentric with the wire guide 340, and has a cutting edge 352 generally diametrically opposed to the wire feed hole 344 of the wire guide 340. The cutter 350 is capable of moving up and down (arrow 354) independent of the sonotrode 330 (and independent of the wire guide, which moves up and down with the sonotrode). However, the cutter 350 may be splined to the wire guide 340 so that its rotational position is maintained constant with respect to the wire guide. When the cutter 350 moves down, it severs (chops off) the wire in "guillotine" fashion. The cutter is generally conventional.

It should be understood that the wire guide 340 may not need to be a complete cylinder, since its function is primarily feeding the wire 316 through the eye 344. Similarly, the cutter 350 may not need to be a complete cylinder, since its function is primarily cutting the wire at a position (with respect to the sonotrode 330) that is diametrically opposed to the feed hole (eye) of the wire guide, but is should have some substantial arcuate extent, such as at least 45 degrees, up to 90 degrees, or up to 180 degrees, so that it can cut misaligned wires.

An advantage of the rotary wire guide (340) and cutting unit (350) is the ability to form the wire in preparation for interconnection, and also to create "squiggles" for UHF antennae. For example, in a dipole antenna having two lengths of wire, each having an end bonded to a terminal of the transponder chip, each length of wire extending in opposite directions away from the transponder chip, a greater length of wire can be mounted to a limited space by making a series of "S-curves", or squiggles.

For the purpose of clarity, the ultrasonic horn (such as sonotrode 330) should be sufficient in size to cover an area at least the width of a high frequency antenna with 4 or 5 turns of wire. This means that the horn heats and presses the self-bonding wire onto the substrate in forming the antenna several times to ensure adequate adhesion. (so, its diameter must be greater than the sum of wire diameters and spacings between the wires) Alternatively, the ultrasonic horn can sink or scribe a wire conductor into a substrate.

Loop Forming, Using the Embedding Tool

As discussed hereinabove, end portions of the antenna wire(s) may not be mounted to (embedded in or adhesively placed on) the substrate, and may remain free-standing, adjacent a terminal area of a transponder site (or, if the transponder is already in place, adjacent the terminals of the transponder), in preparation for bonding, and this may be done at a station which is separate from a station for placing the transponder on the inlay, and separate from a station for bonding the looped end portions of the antenna wire(s) to the terminals of the transponder chip.

FIGS. 4A-4D illustrate an example of embedding (or adhesively placing) a wire 416 (compare 216, 266, 316) in a substrate 402 (compare 202, 252), forming a loop adjacent a terminal area (or terminal) 412 (compare 212/214, 262/264) of a transponder site (not shown, compare 226, 276) or transponder (not shown, compare 210, 260), and forming a pattern such as a rectangular coil pattern for an antenna 416 (compare 116, 216, 266). FIG. 5 is a listing of the steps (method) involved.

As described hereinabove, the embedding tool (300) may start (commence) mounting the antenna and forming the coil pattern for the antenna by lowering itself (arrow 334) down onto the surface of the substrate to urge the wire 416 into the substrate, with the ultrasonic vibrator turned on, to embed a free end of the wire 416, which is under the end (332) of the sonotrode (330) into the surface of the substrate 402. This is denoted by "starting point" labelled "a". See step 502—lower embedding tool, start embedding wire.

Alternatively, if adhesively placing the wire, heat may be used instead of vibration to mount the wire to the surface of the substrate. In this description, mounting by embedding is primarily discussed, but one of ordinary skill in the art will certainly understand how to apply the teachings to adhesively placing a wire on the surface of the substrate.

The embedding tool then moves in a plane (x-y) parallel to the surface of the substrate 402, as indicated by the arrow 419, but only a short distance sufficient to ensure embedding, to the point "b", and then the embedding tool stops vibrating and raises up (arrow 334). See step 504—move only a little, stop embedding, raise embedding tool. The distance between the points "a" and "b" may be 5 to 8 mm.

Next, the embedding tool is moved, and this many include rotationally positioning the wire guide (340), to form a free-standing loop in the wire, between the points "b" and "c". Typically, the free-standing loop will be formed adjacent a terminal area of a device (as discussed hereinabove, which may be before (or after) the device (the transponder chip) is mounted to the substrate The distance between the points "b" and "c" may be 3-5 mm for a chip, or 4-5 mm for a chip module. See FIG. 4C, terminal 412 (corresponding to terminal 112 of device 110 in FIG. 1) See step 506—form a free-standing loop. (It should be understood that the dimensions set forth herein are exemplary and illustrative, and should not be construed as limiting).

As described above, the loop (between the points "b" and "c") may be a "jump" loop similar to a wire bonding loop, in a plane perpendicular to the surface of the substrate, or the loop may be a straight or bowed transit over a slot in the substrate, in the plane of the substrate, in either case the loop being adjacent the terminal area 412. Here, considering FIGS.

4A and 4C together, a loop in a plane somewhere between 0 and 90 degrees to the surface of the substrate is shown, to cover both cases.

Next, at the point "c", loop formation is finished, the embedding tool is again lowered (arrow 334), embedding of the wire 416 resumes (ultrasonic vibrations start), and the embedding tool moves along a prescribed path, parallel to the surface of the substrate, to form a desired pattern, such as the square coil for the antenna 116 shown in FIG. 1. See step 508—resume embedding, describe pattern FIG. 4D shows both terminals 412 and 414 of the transponder chip 410, in dashed lines. FIG. 4C shows only one terminal 412, for illustrative clarity. A showing of the transponder chip 410 is omitted from the view of FIG. 4E, for illustrative clarity.

As best viewed in FIG. 4C, the wire 416, as mounted (and looped) is pre-positioned other than over the terminal 412 of the transponder chip 410 (or, as mentioned before, over a terminal "area" whereat a terminal will be located when the transponder chip is installed), and also it is not over the transponder chip 410 (or transponder chip site, if the transponder is not yet mounted, which may be a recess, such as 226, 276 for the transponder chip). Since the antenna wire 416 does not pass over the terminals of the transponder chip when initially mounted, this allows the transponder chip 410 to be installed after the antenna wire is mounted to (embedded in or adhesively placed on) the substrate, after which the loop(s) in the end portion(s) of the antenna wire(s) are re-positioned (moved, deflected) to be substantially over the respective terminal of the transponder chip for connecting (bonding) thereto.

At the point "d", the embedding tool needs to make a 90-degree turn to form a subsequent (second) side of the rectangular coil (116). The 90-degree corner angle at point "d" is by way of example. Generally, at some point in making the pattern, the tool will have to make some angle, which need not be 90-degrees, it could be more, or less. (Eventually, after moving around the substrate, mounting (embedding or adhesively placing) the antenna wire, the embedding tool will need to return to near its starting point).

Generally, to make a corner (or, more generally, to deviate from a straight line of motion) there are two possibilities. Possibility 1—everything (the sonotrode 330, the wire guide 340, and the cutter 355 can stop moving, then be rotated along the axis (CL) to the desired new path angle (trajectory), and then embedding and moving along the pattern can resume.

For a normal sonotrode having wire being fed down the middle (centreline of the sonotrode), such as in U.S. Pat. No. 6,698,089, that would generally be the case.

With the embedding tool 300, since the wire feed is offset from the centreline (CL), and since the wire guide 340 is rotationally positionable (346) independent of the sonotrode 330, in order to turn the corner, Possibility 2 is that everything stops, the wire guide 340 turns (is rotated 90-degrees with respect to the sonotrode 330 which need not rotate), then movement resumes along the new trajectory to continue with the pattern. See step 510—change direction by rotating wire guide only.

The "turning with wire guide only", is enabled be the fact that the wire does not feed through the sonotrode (330) at all, it only passes under the end of the sonotrode, and since the sonotrode and wire guide are concentric, and in any position of the wire guide with relationship to the sonotrode, the wire passes substantially along a diameter of the sonotrode, substantially under the center point of the end of the sonotrode. It is within the scope of the invention that the entire embedding tool 300 may rotate to a new direction, in conjunction with the wire guide moving to the new direction, so that the combined rotational positioning of the sonotrode and wire guide add up to the desired angle (in this example, 90-degrees) for the new pattern trajectory.

Also, since the end 332 of the sonotrode 330 does not have a channel, and the wire guide is separate, the sonotrode need not rotate. The wire guide 340 (and cutter 350) can rotate around the sonotrode 330.

As best viewed in FIG. 4D, embedding proceeds, as described above, changing angle, as may be required, until the pattern is complete and it is time to make a second loop for connection to a second terminal 414 of the device.

At the point "e", the pattern is illustrated as being on its "final approach" to the second terminal area 414.

The next step is similar to the second part of the step 504. At the point "f", the embedding tool stops vibrating and raises up (arrow 334). See step 512—stop embedding, raise embedding tool.

The next step is similar to the step 506. Next, the embedding tool is moved, and this many include rotationally positioning the wire guide (340), to form a free-standing loop in the wire, between the points "f" and "g". Typically, the free-standing loop will be formed adjacent a terminal area of a device (as discussed hereinabove, which may be before (or after) the device is mounted to the substrate The distance between the points "b" and "c" may be 4 to 5 mm for a chip module. See FIG. 4C, terminal 414 (corresponding to terminal 114 of device 110 in FIG. 1) See step 514—form a free-standing loop.

The next step is similar to the first part of the step 504. The embedding tool then moves in a plane (x-y) parallel to the surface of the substrate 402, but only a short distance sufficient to ensure embedding, to the point "h", and then the embedding tool stops vibrating and the cutting tool 350 severs (cuts) the wire (arrow 354). See step 516—sever wire.

The embedding tool can then move to another location on a substrate to prepare another site with an antenna and loops. See step 518—move to another inlay (transponder) location on the inlay substrate.

Note that in FIG. 4D the loops are illustrated as being formed in an opposite direction from how they may ultimately be attached to the terminals 412, 414 of the device, such as was shown in FIG. 1 (or in the S5 provisional, looping method #2). This is simply to illustrate that the loops may be formed other than over the terminals of the device, later to be moved (deflected, repositioned) over the terminals, then bonded to the terminals.

In FIG. 4E, the loops are shown having been re-positioned over the terminal areas 412 and 414 (which, once the transponder chip is installed is the terminals themselves), for subsequent bonding to the terminals of the transponder chip.

Bonding then may proceed in any conventional manner. The wire ends of the antenna, now residing over the terminals of the chip, are bonded to the terminals of the chip. The interconnection (bonding) process can for example be inner lead bonding (diamond tool), thermal compression bonding (thermode), ultrasonic bonding or laser welding. Prior to interconnection the insulation layer of the wire conductor can be removed.

Section 4

This section is directed to additional features, such as:
Insulated, Self-Adhering wire
Insulation Removal
Personalizing an Inlay
Anti-skimming These and other features disclosed herein may be combined with one another in various ways, some of which have been mentioned hereinabove.

Insulated, Self-Adhering Wire

As discussed hereinabove, the antenna wire may be mounted to the substrate by adhesively placing it, rather than embedding it. To do so, generally requires a "self-adhering" wire, an appropriate substrate material, and means for causing the wire to adhere to the substrate.

In this section, the use of a "self-bonding" (or "self-adhering") wire that is mounted by adhesion to the surface of the substrate (such as 302) rather than embedded into the surface of the substrate is discussed. The tool description is based on the embedding tool of FIG. 3, which can be modified to perform the adhering function rather than the embedding function.

According to this feature of the invention, the insulated wire which makes up the antenna is placed onto or embedded into the substrate by means of a wire placement/embedding head incorporating a wire clamping & feeding mechanism, an ultrasonic horn, a rotary wire guide and cutting unit, and optionally a UV curing station. Furthermore, the insulated wire can have a coating of self-bonding material to facilitate the adhesion of the insulted enamel wire to a substrate comprising a synthetic material such as Teslin.

FIG. 6 illustrates an embodiment of an insulated, self-adhering wire 600 comprising:
- a metallic core 602, having a diameter;
- a first non-metallic coating 604 disposed on the surface of the metallic core 602; and
- a second non-metallic coating 606 disposed on the surface of the first metallic coating 604.

The core 602 may comprise copper, aluminum, doped copper, gold, or Litz wire, and may have a diameter of 0.010-0.50 mm (AWG 24-58) (0.010 mm=100 micron).

| Litz wire | Litz wire is a special type of wire used in electronics. It consists of many thin wires, individually coated with an insulating film and braided, thus increasing the surface area of the conductor and thereby reducing the skin effect and associated power losses when used with high-frequency applications. The word originated from Litzendraht, German for braidswire. |
|---|---|

The first coating 604, or "base coat" 604 may comprise modified polyurethane, and may have a thickness of only a few microns.

The second coating 606, or "bond coat" 604 may comprise polyvinylbutyral or polyamide, and may have a thickness of only a few microns.

The composition of the insulated wire can have a base coat of modified polyurethane and a bond coat of polyvinylbutyral or polyamide.

When mounting (adhesively placing) self-bonding wire, the wire coating is chemically changed to react to the heat generated by the rubbing with the ultrasonic horn (sonotrode 330). Additionally, ultraviolet (UV) light radiation may be used, in a curing station. The self-bonding coating affords the strength of bonding (adhesively placing, or positioning) the wire to the substrate with the ultrasonic horn, while the UV light hardens the adhesion.

In polymer chemistry and process engineering, "curing" refers to the toughening or hardening of a polymer material by cross-linking of polymer chains, brought about by chemical additives, ultraviolet radiation or heat.

Insulation Removal

As mentioned above, it is desirable to remove the insulation from at least a portion (such as the tips) of the loops prior to bonding the looped ends of the antenna wire to terminals of the transponder chip (or chip module).

As mentioned above, removal of insulation can be performed either (i) as the loops are being formed, or (ii) after the antenna is mounted (embedded or placed) on the substrate and the loops have already been formed, prior to bonding the loops to the terminals of the transponder chip.

In elaborating on the method to position the wire ends of an antenna adjacent to the terminal areas of an RFID chip as well as removing the insulation from the wire in preparation for interconnection, it is particularly advantageous to have the insulation removal unit close to the wire embedding tool. The removal of the insulation can be per laser, gas flame or mechanical splicing. By having the insulation removal unit close to the wire placing or embedding tool, it is possible to know the exact location of the insulation removal, so as to position a portion of dangling wire along side the terminal area of the chip. For the purpose of clarity, the wire is first placed or embedded in commencing a transponder site adjacent to the chip, the un-insulated dangling wire is positioned along side the first terminal area of the chip, then the wire is placed or embedded to form an antenna and finally the wire end is left to dangle along side the second terminal area before placing or embedding the wire onto or into the substrate before cutting the wire. In the next stage of the process, the dangling wire is clamped and formed in preparation for interconnection.

FIG. 7A is similar to FIG. 3B, and illustrates removing insulation from the wire 716 (compare 316) immediately before it is mounted to (embedded in or adhesively positioned on) the substrate (not shown). The sonotrode 330, wire guide 340 and cutting mechanism of the embedding tool 300 are shown in this figure, as well as the eye 344 in the end of the wire guide 340 and the embedding end 332 of the sonotrode 330.

Although an insulated wire can be bonded to a terminal of a chip, it is desirable to remove the insulation from the wire prior to interconnection (bonding to the terminal of the transponder chip) to ensure that no insulation residue is under the wire conductor at the bond site.

Before passing through the eye 344 of the wire guide 340, the wire 716, which is a coated wire, passes through an insulation-removal station 770, which may comprise a nozzle where laser light can be introduced via a glass fiber, to remove (ablate) the insulation from the wire 716. After passing through the insulation-removal station 770, the wire is no longer coated, as indicated by the primed reference numeral 716'.

As shown in the drawing, a distance "s" represents how far in advance, along the length of the wire, the insulation needs to be removed to control its final destination (such as at the tip of a loop).

FIG. 7B is similar to a portion of FIG. 2C, and illustrates insulation-removal apparatus 780 such as a laser emitting a beam 781 for removing insulation from an insulated wire after the wire has been mounted, and before the loops are bonded to terminals of a transponder chip.

In this example, the beam 781 is aimed at a tip of a loop formed at an end 766a (compare 266a) of a wire 766 (compare 266) which is looped adjacent a terminal 762 (compare 262) of a transponder chip 710 (compare 260) on a substrate 752 (compare 252). A second terminal 764 (compare 264) is shown. A recess 776 (compare 276) for the chip 760 (compare 260) is shown.

With these planar loops, with the insulted wire passing over slots 782, 784 in the substrate 752, it is particularly advantageous to use an ultra-violet (UV) laser 780 to remove the insulation. The UV laser uses optical directing systems to remove the insulation, and the wire can be flooded (or protected by) with an inert gas, such as nitrogen, to avoid oxidation of the bare (such as copper) wire before bonding. In addition, the wire can be metalized with a coat solder or any metal to enhance the interconnection (bonding) process.

For jump loops (see FIGS. 2A, 2B), the procedure may be quite similar to what is shown in FIG. 7B for planar loops—namely, after the loop is formed, and typically before the transponder chip is installed, if the wire is insulated wire, the insulation is removed from at least the portion of the loop that will be connected (bonded) to the terminal of the transponder chip, typically before the loop is repositioned.

With a planar loop (FIGS. 2C, 2D) spanning a slot, it may be desirable that the wire traverse the slot in a straight line (rather than in a "horizontal loop"), and that is held taut (rather than slack, as suggested hereinabove, to facilitate re-positioning the wire) by being embedded on either side of the slot (refer, for example, to FIG. 4E where the wire is mounted before the loop between points "a" and "b", the loop is between the points "b" and "c", and the wire is again mounted after the point "c").

Personalizing the Inlay

This embodiment of the invention relates to doping the substrate with microscopic metal filings to form dipoles which creates a unique number when interrogated by an ultra high frequency reader and storing this information in the RFID chip on the substrate for enhanced security. The technique is known for bank notes.

U.S. Pat. No. 6,471,878 (Greene et al.) describes a method for forming a radio frequency responsive target and apparatus for verifying the authenticity of same. The abstract reads, as follows:

A method for forming a radio frequency responsive target formed of a pattern of thin dipoles, each of which has a position and angular orientation within the pattern, which produce a composite analog radio frequency signal in response to an interrogating signal. A first metallic film layer is deposited on top of a non-conductive substrate, an etchant resistant pattern correspondent to the thin dipole pattern is deposited on top of the first metallic film layer, and a second metallic layer occupying the first metallic layer in at least one area without etchant is applied on top of the first metallic film layer. The etchant resistant pattern is removed to expose portions of the first metallic film layer, and the second metallic layer and the exposed portions of the first metallic film layer are etched simultaneously.

Doping a substrate with microscopic metal filings may produce a composite analog radio frequency signal in response to an interrogating signal. Building on this concept, this embodiment (or feature) of the invention is to use microscopic metal filings as dipoles scattered and embedded over a section of the inlay substrate for identification and authentication purposes. Using an ultra high frequency reader the dipoles transmit (backscatter) in composite form a unique number to the reader. This means that every substrate or inlay site can have a unique number and this number is stored in the RFID chip for verification.

Alternatively, an optical polymer memory operating on the basis of hologram interference patterns can store unique codes which can be used to identify the substrate or inlay site.

In addition to optical memory, it is also possible to print an RFID tag by depositing polymers on the insulated substrate to form organic thin film transistors (n-type and p-type). Polymers can be applied at room temperature and atmospheric pressure, utilizing ink jets or printing press methods to build the organic semiconductor.

Anti-Skimming

According to this embodiment (feature) of the invention, generally, for privacy protection, a thin radio shield (anti-skimming material as a metal mesh or ferrite layer) can incorporates into the inlay substrate, such as sandwiched between two of the layers of the inlay substrate, whereby a capacitive gap remains between the transponder layer and the layer with the anti-skimming material. This means that the digital information in the chip(s) can only be read from one direction at short distance. The passport reader may have a ferrite cover or magnetic medium to enhance the read/write range when the electronic passport is being interrogated.

FIG. 8 illustrates an inlay 800 comprising a multi-layer substrate 802 (compare 202) having one or more top layers 802a, one or more layers 802b beneath (underlying) the top layers 802a, one or more layers 802c beneath (underlying) the layers 802b, and one or more layers 802d beneath (underlying) the layers 802c. By way of example, a recess 826 (compare 226) extends through the top layers 802a, a transponder chip 810 (compare 210) is disposed in the recess 826 and supported on the underlying layers 802b, the transponder chip 810 has at least one terminal 812 (compare 212), and an end portion of an antenna wire 816 (compare 216) is connected to the terminal 812.

The various layers 802a, 802b, 802c, and 802d may comprise several layers of material (synthetic, fabric and or paper). The number of layers of material is generally dependent on the thickness requirement of the final product such as a card, ticket or electronic document. The mixture of materials depends on the life expectancy and the durability requirement of the final product.

A metallic, non-ferrous material, such as an aluminum mesh may be incorporated in one of the lower layers to attenuate flux (readability) in one direction—to make the inlay 800 less vulnerable to skimming (unauthorized reading). Here, an aluminum mesh 803 is shown incorporated into the bottommost layer 802d of the substrate 802, particularly under the wire 816. The aluminum mesh 803 is intended to reduce coupling (attenuate the RF field in one direction) to an external reader (not shown) in the downward (as viewed in the figure) direction.

A layer, such as an overlying layer (not shown) atop the layer 802a, may contain ferrite to enhance coupling between the inlay and a reader (not shown) in that direction, thereby enhancing the "read distance" when in the electromagnetic field of the reader. Combined with the aluminum mesh feature 803, this may provide enhanced coupling and enhanced anti-skimming protection.

FIG. 8 also shows microscopic metal filings 805, in the second layer 802b, for personalizing the inlay 800, as discussed hereinabove.

Re-Positioning Loops

The forming of jump loops (FIGS. 2A, 2B) and planar loops (FIGS. 2C,2D), and pre-positioning the loops adjacent terminals of a transponder chip, has been discussed hereinabove.

FIG. 9A shows a substrate 902 (compare 202) with a recess 926 (compare 226) having a transponder chip 910 (compare 210) disposed in the recess. The transponder chip 910 has a terminal 912 (compare 212). An antenna wire 916 (compare 216) is mounted to the substrate. A jump loop is formed in an end portion (compare 216a or 216b) of the antenna wire and is shown (in dashed lines) pre-positioned, free-standing, in a vertical plane, in preparation for being re-positioned atop the terminal 912 for connection (bonding) thereto.

A simple mechanical tool 960, such as elongate member with a pushing end 962 may be urged against the free-standing loop to push it over onto (above, it need not be touching) the terminal 912 of the chip 910, as indicated by the arrow 964. The end 962 may be concave to "capture" the wire. The re-positioned wire is shown as a solid line, and reference numeral 916' (primed).

Alternatively, a "hook" type tool could be used to pull (rather than push) the wire to reposition it over the terminal. A hook type tool is shown in FIG. 9B.

FIG. 9B shows a substrate 952 (compare 252) with a recess 976 (compare 276) having a transponder chip 960 (compare 260) disposed in the recess. The transponder chip 960 has a terminal 962 (compare 262). An antenna wire 966 (compare 266) is mounted to the substrate. A planar loop is formed in an end portion (compare 266a or 266b) of the antenna wire and is shown pre-positioned, traversing a slot 982 (compare 282) through the substrate, in preparation for being re-positioned atop the terminal 962 for connection (bonding) thereto.

A "push" tool such as 960 (FIG. 9A) can be inserted from below the slot to push the wire 966 up above the surface of the substrate 952, as indicated by the arrow 976, followed by a "pull" tool 978, in the form of a hook to pull the wire 966 over to atop the terminal 962. The re-positioned wire is indicated by reference numeral 966' (primed). (As used herein, generally, a "hook" is an elongate member, having a curved end which curves back towards the shank of the hook at least 90 degrees, up to 180 degrees).

Alternatively, a push tool (as before) can be inserted from below the slot to push the wire 966 up above the surface of the substrate 952, followed by an other "push" tool (similar to 960) to push the wire 966 over to atop the terminal 962.

Alternatively, a single hook-type pull tool (such as 978) may be inserted into the slot 982 from above, grabbing the wire 966, pulling it up a little then over to atop the terminal 962.

The wire 966 may be either go straight across the slot 982, and may be taut (firmly embedded on either side of the slot), or it may be slightly slack.

Manufacturing Flow

The process steps to produce a high frequency transponder inlay using the jump loop method may generally be characterized as:

Step 1, embedding a wire conductor into a substrate and creating a jump loop adjacent to the position of the first terminal area of an unplaced chip; routing the wire conductor to form an antenna with a given number of turns and then creating a second jump loop adjacent to the position of the second terminal area of an unplaced chip.

Step 2, removing the insulation layer from the tip of each jump loop using for example an ultra violet laser, in preparation for interconnection. It should be noted that the insulation layer can be removed before the loops are formed.

Step 3, an RFID chip is embedded into the substrate using thermal energy for the purpose of sinking or attaching the chip into or onto the substrate. In the case of a chip module, it may be advantageous to have a cavity to accept the contour of the mould mass or the entire module.

Step 4, the jump loops are drawn in over the terminal areas using a mechanical gripper on each side of the chip.

Step 5, the un-insulated loops residing over the terminal areas of the chip are interconnected for example using thermal compression bonding, ultrasonic bonding or laser welding.

FIG. 10 illustrates a manufacturing flow 1000, showing a possible organization for the various manufacturing steps set forth hereinabove.

In a first step 1002, a substrate is prepared. The substrate may have one or more (an array of) inlay sites. The substrate may be a multi-layer substrate, as discussed above. A given inlay site may have a recess (cavity, window) and may have slots, as described above. Substrates may be prepared well ahead of time, "off-line".

In a next step 1004, and antenna wire is mounted to (embedded in, adhesively placed on) the substrate, as discussed above, leaving end portions of the wire un-mounted, and forming pre-positioned loops, as discussed hereinabove. (See FIGS. 2A/2B, and 2C/2D, also FIGS. 4 and 5).

Two mounting procedures have been discussed hereinabove—(1) embedding the wire in the surface of the substrate, and (2) "adhesively positioning" a self-bonding wire to the surface of the substrate.

In a next step 1006, which can be skipped if the wire is being embedded in rather than adhesively placed on the substrate, the self-bonding wire may be cured to the substrate, such as by using ultraviolet light, as discussed hereinabove.

In a next step 1008, which can be skipped if the wire is not insulated, the insulation is removed from the looped (un-mounted) portions of the wire, as discussed hereinabove. If the wire is an insulated wire, the insulation can be removed either during mounting (see FIG. 7A), or after mounting (see FIG. 7B), as discussed hereinabove.

As discussed hereinabove, there are generally two possibilities regarding chip installation—(1) the chip may have been installed on the substrate prior to mounting the wire and forming the loops (and, if necessary, curing and removing insulation from the wire), or the chip may be installed on the substrate after mounting the wire and forming (pre-positioning) the loops.

In the process flow illustrated here, in a next step 1010, the transponder chip is installed on the inlay substrate after mounting the wire forming the loops. Again, it should be understood that the substrate may be set up for a plurality of inlays, receiving a plurality of transponder chips, such as a 3×6 array of inlays. Also, referring back to FIG. 1, it should be remembered that each secure inlay may comprise two transponder chips which may be placed in this step.

One of ordinary skill in the art will readily understand how this, or other steps recited in this "fab flow" may be rearranged, recombined and/or omitted to suit particular circumstances.

Next, in a step 1012, the loops are repositioned over terminals of the transponder chip, in preparation for connecting (bonding) the ends of the antenna wire(s) to the terminals of the chip, as discussed hereinabove. The antenna may be a single wire coil loop having two ends, or may be two wires forming a dipole, each of the dipole wires having one end for connecting to a terminal of the transponder chip, as discussed above.

Next in a step 1014, the loops of the antenna(s) are connected (bonded) to the terminals of the transponder chip.

Next, in a step 1016, various post-processing steps may be performed, such as assembling the transponder inlay with additional layers of sheets in preparation for lamination In a step 1018, if there are a plurality of inlays on a common substrate, they may be singulated (separated) from the substrate.

In a step 1020, various post-processing steps applicable to individual secure inlays may be performed.

Generally, each of the steps discussed hereinabove may be performed at a different station, or stations, in a manufacturing environment. This has various advantages, such as improved yields from the manufacturing process and greater throughput from the embedding machine with less operators.

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

What is claimed is:

1. Method of forming an inlay substrate comprising an antenna wire and a site for a transponder chip, comprising:
   while mounting the antenna wire to a surface of a substrate leaving end portions, exclusive of ends of the antenna wire unmounted and positioned adjacent the site for the transponder chip, wherein the ends of the antenna wire are mounted to the surface of the substrate;
   installing the transponder chip at the site for the transponder chip, between the unmounted end portions of the antenna wire; and
   repositioning the unmounted end portions of the antenna wire to be directly over terminals of the transponder chip;
   wherein the site for the transponder chip comprises a recess in the substrate, and further comprising:
   providing slots in the substrate, adjacent opposite sides of the recess;
   wherein the antenna is formed by:
   passing the antenna wire over a first one of the slots in the substrate along a side of the site for the transponder chip;
   routing the antenna wire to form an antenna with a given number of turns; and
   passing the antenna wire over a second one of the slots in the substrate along an opposite side of the site for the transponder chip.

2. The method of claim 1, further comprising:
   bonding the repositioned unmounted end portions of the antenna wire to the terminals of the transponder chip.

3. The method of claim 2, wherein the antenna wire comprises a metallic wire covered by a coating of insulation, and further comprising:
   removing the insulation from the unmounted end portions of the antenna wire prior to bonding.

4. The method of claim 3, wherein:
   removing the insulation is performed using a laser.

5. The method of claim 3, wherein:
   removing the insulation is performed during mounting the antenna wire.

6. The method of claim 3, wherein:
   removing the insulation is performed after mounting the antenna wire.

7. The method of claim 3, further comprising:
   providing slots in the substrate, under at least the portion of the unmounted end portions of the antenna wire whereat the insulation is removed.

8. The method of claim 1, wherein mounting the antenna wire comprises:
   embedding the antenna wire in the surface of the substrate.

9. The method of claim 1, wherein mounting the antenna wire comprises:
   adhesively placing the antenna wire on the surface of the substrate.

10. The method of claim 1, wherein the unmounted end portions of the antenna wire are formed as generally upside-down U-shaped loops, similar in appearance to conventional wire-bonding loops.

11. The method of claim 1, wherein the site for the transponder chip comprises a recess in the substrate.

12. The method of claim 11, wherein:
    the unmounted end portions of the antenna wire span the recess as wire bridges.

13. The method of claim 1, wherein the antenna wire comprises a metallic wire covered by a coating of insulation, and further comprising:
    removing the insulation from a portion of the antenna wire passing over each slot in the substrate;
    installing the transponder chip at the site for the transponder chip, so that terminals of the transponder chip are along side the respective portion of the antenna wire passing over the respective slot;
    drawing the antenna wire in over the terminals of the transponder chip; and
    bonding the antenna wire to the terminals of the transponder chip.

14. The method of claim 1, wherein:
    the substrate comprises a multi-layered substrate.

15. The method of claim 1, wherein the transponder chip is installed at the site before the antenna wire is mounted to the substrate.

16. The method of claim 1, wherein the transponder chip is installed at the site after the antenna wire is mounted to the substrate, from the same side of the substrate that the antenna is mounted to.

17. Method of forming an inlay substrate comprising an antenna wire and a site for a transponder chip, comprising:
    while mounting the antenna wire to a surface of a substrate leaving end portions, exclusive of ends of the antenna wire unmounted and positioned adjacent the site for the transponder chip, wherein the ends of the antenna wire are mounted to the surface of the substrate;
    installing the transponder chip at the site for the transponder chip, between the unmounted end portions of the antenna wire; and
    repositioning the unmounted end portions of the antenna wire to be directly over terminals of the transponder chip;
    wherein the site for the transponder chip comprises terminal areas whereat terminals of the transponder chip will be located, further comprising:
    at a point on the surface of the substrate, commencing mounting the antenna wire;
    continuing mounting the antenna wire a short distance;
    forming a first of the unmounted end portions of the antenna wire in the antenna wire adjacent a first of the terminal areas for the transponder chip;
    resuming mounting the antenna wire on the substrate with a given number of turns;
    forming a second of the unmounted end portions of the antenna wire in the antenna wire adjacent a second of the terminal areas for the transponder chip; and
    continuing mounting the antenna wire a short distance; and severing the wire.

* * * * *